United States Patent
Kim et al.

(10) Patent No.: US 10,008,616 B2
(45) Date of Patent: Jun. 26, 2018

(54) ELECTRONIC DEVICE HAVING SCHOTTKY DIODE

(71) Applicant: Samsung Electronics Co., Ltd., Suwon-si (KR)

(72) Inventors: Yong Don Kim, Suwon-si (KR); Seo In Pak, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/465,697

(22) Filed: Mar. 22, 2017

(65) Prior Publication Data

US 2017/0373199 A1    Dec. 28, 2017

(30) Foreign Application Priority Data

Jun. 28, 2016  (KR) ........................ 10-2016-0081018

(51) Int. Cl.
| | |
|---|---|
| *H01L 29/49* | (2006.01) |
| *H01L 29/872* | (2006.01) |
| *H01L 27/08* | (2006.01) |
| *H01L 29/06* | (2006.01) |

(52) U.S. Cl.
CPC ........ *H01L 29/872* (2013.01); *H01L 27/0814* (2013.01); *H01L 29/0649* (2013.01)

(58) Field of Classification Search
CPC ........................ H01L 27/2436; H01L 45/1233
See application file for complete search history.

(56) References Cited

U.S. PATENT DOCUMENTS

| | | |
|---|---|---|
| 6,998,678 B2 | 2/2006 | Werner et al. |
| 7,064,407 B1 | 6/2006 | Mallikarjunaswamy |
| 7,242,071 B1 | 7/2007 | Liu et al. |
| 7,633,135 B2 | 12/2009 | Hebert |
| 7,936,041 B2 | 5/2011 | Johnson et al. |
| 8,492,841 B2 | 7/2013 | Anderson et al. |
| 8,592,293 B2 | 11/2013 | Johnson et al. |
| 2003/0127687 A1 | 7/2003 | Kumagai et al. |
| 2005/0199978 A1 | 9/2005 | Takayama |
| 2006/0071292 A1 | 4/2006 | Coolbaugh et al. |
| 2006/0113624 A1 | 6/2006 | Wu |
| 2006/0131619 A1 | 6/2006 | Wu |

(Continued)

*Primary Examiner* — Michael Shingleton
(74) *Attorney, Agent, or Firm* — Muir Patent Law, PLLC

(57) ABSTRACT

The electronic device having a Schottky diode includes first and second electrodes disposed on a semiconductor substrate and spaced apart from each other. A first semiconductor region is formed within the semiconductor substrate. The first semiconductor region may include a first surface portion in contact with the second electrode, forming a Schottky diode with the second electrode. A second semiconductor region having the same conductivity-type as the first semiconductor region and overlapping the first electrode is formed within the semiconductor substrate. A third semiconductor region having a different conductivity-type from the first semiconductor region, and having a first portion and a second portion spaced apart from each other, is formed within the semiconductor substrate. An isolation region is disposed between the second and the third semiconductor regions. The isolation region includes a first isolation portion and a second isolation portion spaced apart from each other.

20 Claims, 20 Drawing Sheets

(56) References Cited

U.S. PATENT DOCUMENTS

| | | | |
|---|---|---|---|
| 2007/0200134 A1* | 8/2007 | Therrien | H01L 29/2003 257/103 |
| 2011/0084353 A1* | 4/2011 | Chao | H01L 29/402 257/484 |
| 2011/0250736 A1 | 10/2011 | Ohta et al. | |
| 2012/0018837 A1 | 1/2012 | Anderson et al. | |
| 2012/0326261 A1 | 12/2012 | Chan et al. | |
| 2013/0001734 A1 | 1/2013 | Yang et al. | |
| 2013/0093038 A1 | 4/2013 | Lee et al. | |
| 2013/0328122 A1 | 12/2013 | Li et al. | |
| 2013/0341705 A1 | 12/2013 | Raghavan et al. | |
| 2014/0035090 A1 | 2/2014 | Qu et al. | |
| 2014/0048850 A1 | 2/2014 | Jeon et al. | |
| 2014/0061731 A1 | 3/2014 | Chen et al. | |
| 2014/0073098 A1 | 3/2014 | Calafut et al. | |
| 2014/0103357 A1 | 4/2014 | Decoutere et al. | |
| 2014/0145213 A1 | 5/2014 | Henning et al. | |
| 2014/0145289 A1 | 5/2014 | Zhang | |
| 2014/0183622 A1 | 7/2014 | Lin et al. | |
| 2014/0203355 A1 | 7/2014 | Kocon et al. | |
| 2014/0295628 A1 | 10/2014 | Kuo | |
| 2016/0013182 A1 | 1/2016 | Chen et al. | |
| 2016/0020272 A1 | 1/2016 | Kim | |
| 2016/0043169 A1 | 2/2016 | Guan et al. | |
| 2016/0043198 A1 | 2/2016 | Edwards et al. | |
| 2016/0056284 A1 | 2/2016 | Goerlach | |
| 2016/0308071 A1* | 10/2016 | Lin | H01L 29/872 |
| 2016/0372609 A1* | 12/2016 | Kiyama | H01L 29/872 |
| 2017/0365595 A1* | 12/2017 | He | H01L 27/0255 |
| 2017/0373199 A1* | 12/2017 | Kim | H01L 29/872 |
| 2018/0026143 A1* | 1/2018 | Ren | H01L 29/872 |

\* cited by examiner

ELECTRONIC DEVICE HAVING SCHOTTKY DIODE

CROSS-REFERENCE TO RELATED APPLICATION

This application claims benefit of priority under 35 U.S.C. § 119 to Korean Patent Application No. 10-2016-0081018, filed on Jun. 28, 2016, in the Korean Intellectual Property Office, the disclosure of which is incorporated herein by reference in its entirety.

BACKGROUND

1. Field

The present concepts relate to an electronic device having a Schottky diode.

2. Description of Related Art

A Schottky diode using rectifying action occurring at a contact surface of a metal and a semiconductor, is used in various electronic devices.

SUMMARY

In some aspects, the disclosure is directed to an electronic device comprising: a semiconductor substrate; a first electrode and a second electrode disposed on the semiconductor substrate and spaced apart from each other; a first semiconductor region formed within the semiconductor substrate, the first semiconductor region including a first surface portion in contact with the second electrode and forming a Schottky diode with the second electrode; a second semiconductor region formed within the semiconductor substrate, having the same conductivity-type as that of the first semiconductor region, and vertically overlapping the first electrode; and a third semiconductor region formed within the semiconductor substrate, having a different conductivity-type from that of the first semiconductor region, and vertically overlapping the second electrode; and an isolation region between the second semiconductor region and the third semiconductor region, wherein the isolation region includes a first isolation portion and a second isolation portion spaced apart from each other, when viewed in a plan view.

In some aspects, the disclosure is directed to an electronic device comprising: a semiconductor substrate; a first electrode and a second electrode provided on the semiconductor substrate; a first semiconductor region in the semiconductor substrate, the first semiconductor region including a first surface portion in contact with the second electrode; a second semiconductor region in the semiconductor substrate, the second semiconductor region having the same conductivity-type as that of the first semiconductor region and overlapping the first electrode; a third semiconductor region in the semiconductor substrate, the third semiconductor region having a different conductivity-type from that of the first semiconductor region, overlapping the second electrode, and including portions spaced apart from each other; and an isolation region between the second semiconductor region and the third semiconductor region.

In some aspects, the disclosure is directed to an electronic device comprising: a semiconductor substrate; a first electrode and a second electrode provided on the semiconductor substrate; a first semiconductor region formed in the semiconductor substrate, the first semiconductor region including a first surface portion in contact with the second electrode to form a Schottky diode with the second electrode; a second semiconductor region formed in the semiconductor substrate and vertically overlapping the first electrode; a third semiconductor region formed in the semiconductor substrate and vertically overlapping the second electrode; and an isolation region between the second semiconductor region and the third semiconductor region, wherein the isolation region includes a first isolation portion and a second isolation portion spaced apart from one another when viewed in a plan view, and an isolation disconnection region between the first isolation portion and the second isolation portion, and wherein the isolation disconnection region provides a current path between the first isolation portion and the second isolation portion.

BRIEF DESCRIPTION OF DRAWINGS

The above and other aspects, features and other advantages of the present concepts will be more clearly understood from the following detailed description taken in conjunction with the accompanying drawings, in which.

DETAILED DESCRIPTION

Figure 1A:
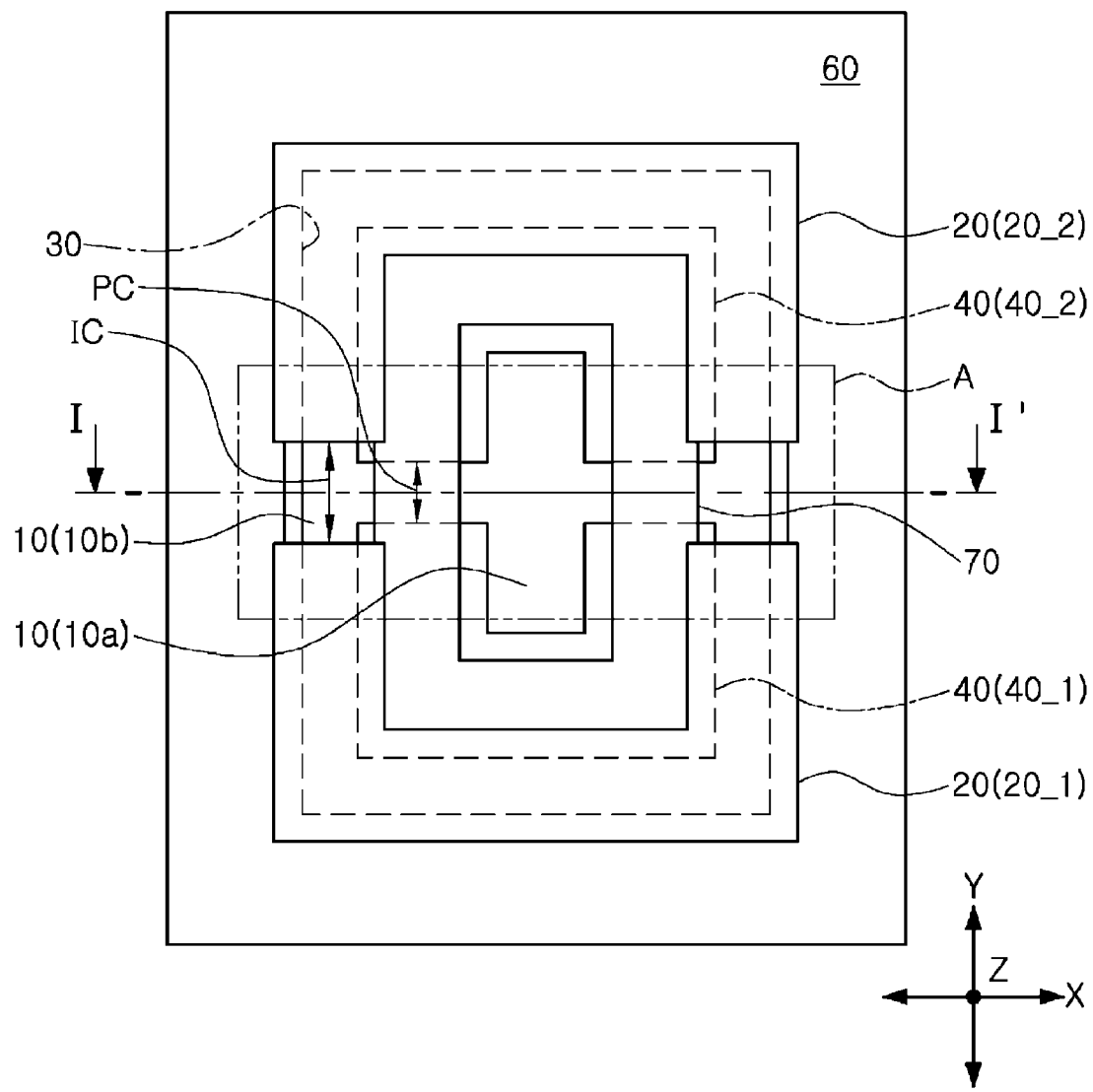
FIGS. 1A and 1B are plan views illustrating an electronic device according to an example embodiment.

The semiconductor devices described herein embodied as an electronic device, such as a semiconductor memory chip or semiconductor logic chip, a stack of such chips, a semiconductor package including a package substrate and one or more semiconductor chips, a package-on-package device, or a semiconductor memory module, for example. The semiconductor devices described herein may be embodied as a volatile or non-volatile memory. A chip or package that includes such semiconductor devices may also be referred to generally as a semiconductor device.

As used herein, the terms "material continuity" and "materially in continuity" may refer to structures, patterns, and/or layers that are formed at the same time and of the same material, without a break in the continuity of the material of which they are formed. As one example, structures, patterns, and/or layers that are in "material continuity" or "materially in continuity" may be homogeneous monolithic structures. Structures, patterns, and/or layers described herein as "continuously formed" may be materially in continuity. The term "buried" may refer to structures, patterns, and/or layers that are formed at least partially below a top surface of another structure, pattern, and/or layer. In some embodiments, when a first structure, pattern, and/or layer is "buried" in a second structure, pattern, and/or layer, the second structure, pattern, and/or layer may surround at least a portion of the first structure, pattern, and/or layer. For example, a first structure, pattern, and/or layer first may be considered to be buried when it is at least partially embedded in a second structure, pattern, and/or layer.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to, or "on" another element, it can be directly connected or coupled to, or on the other element or intervening elements may be present. In contrast, when an element is referred to as being "directly connected," "directly coupled," in or "directly on" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a connection contact (i.e., touching) unless the context indicates otherwise.

Figure 1B:
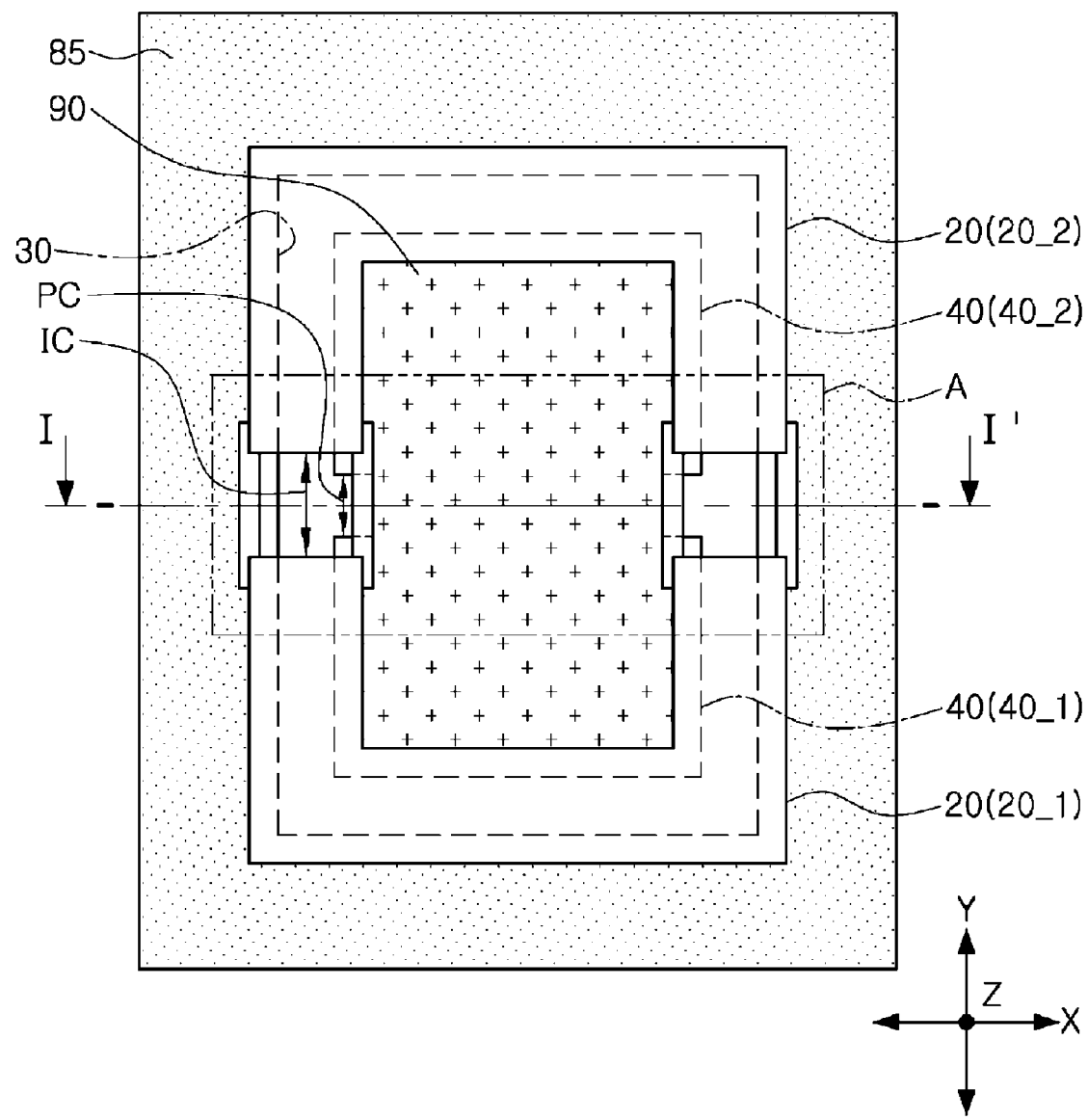
Figure 2A:
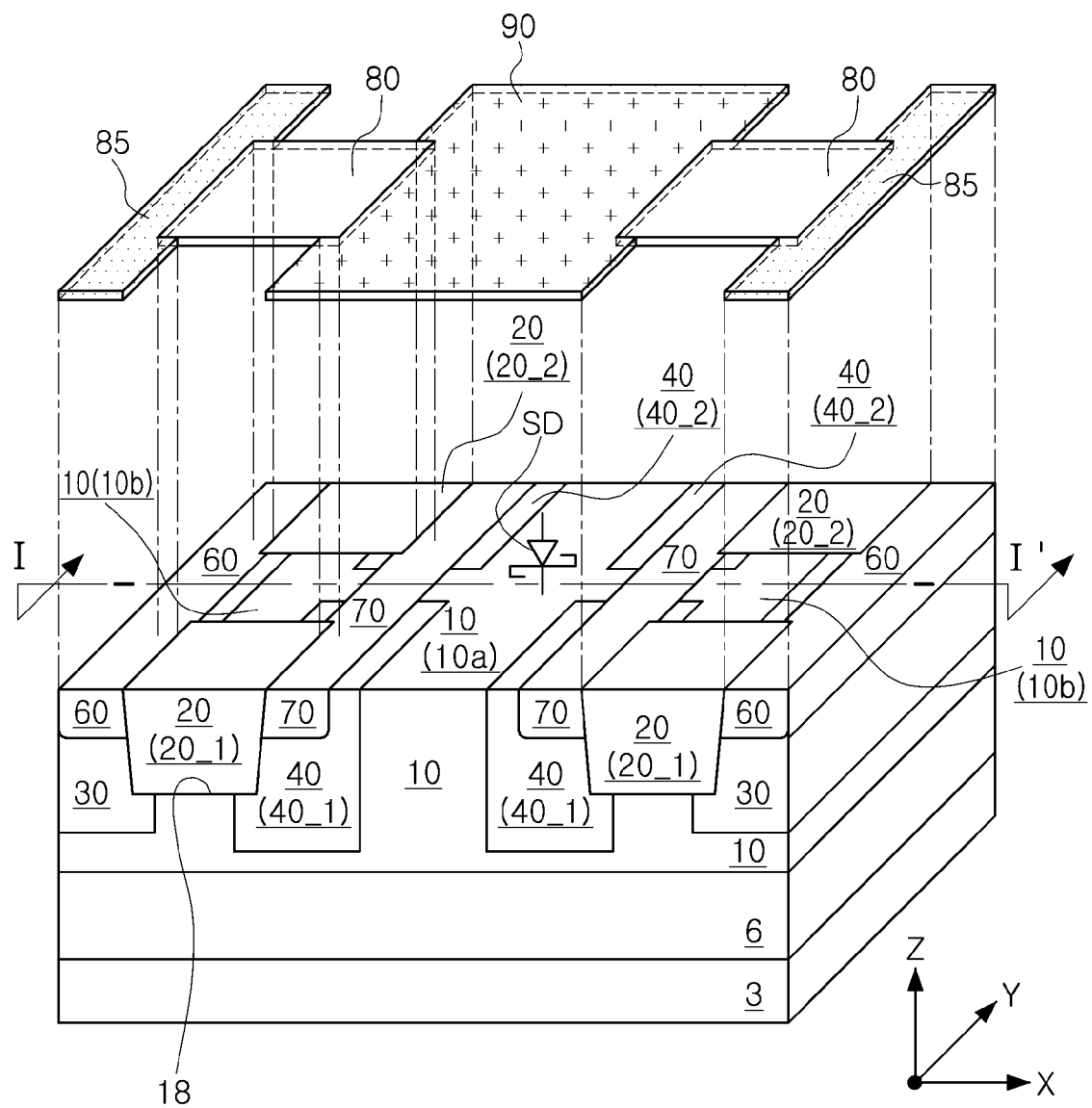
FIG. 2A is a perspective view of portion A in FIGS. 1A and 1B.
Figure 2B:
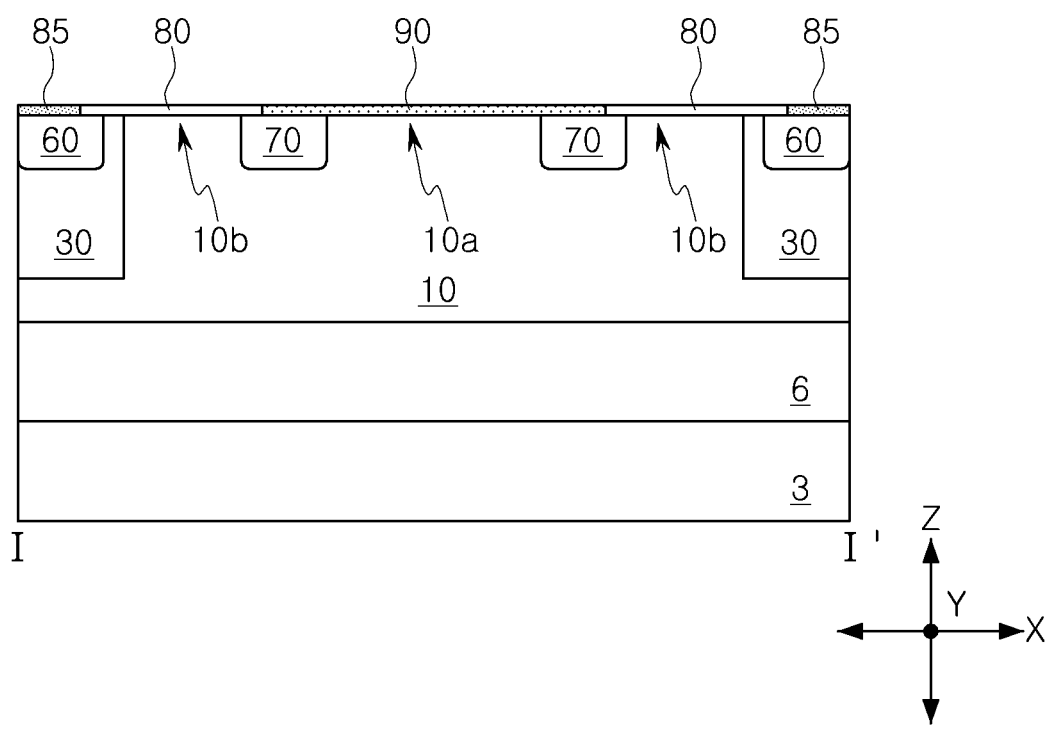
FIG. 2B is a cross-sectional view illustrating a region taken along line I-I' in FIGS. 1A, 1B, and 2A.

FIGS. 1A and 1B are plan views illustrating an electronic device according to an example embodiment, FIG. 2A is a perspective view illustrating portion A shown in FIGS. 1A and 1B, and FIG. 2B is a cross-sectional view illustrating a region taken along line I-I' shown in FIGS. 1A, 1B, and 2A.

With reference to FIGS. 1A, 1B, 2A, and 2B, a buried semiconductor region 6 may be formed within a semiconductor substrate 3. The semiconductor substrate 3 may be formed of a semiconductor material, such as, for example, silicon, a semiconductor compound, or the like.

The buried semiconductor region 6 may have a different conductivity-type from that of the semiconductor substrate 3. For example, the semiconductor substrate 3 may have P-type conductivity, and the buried semiconductor region 6 may have N-type conductivity. The buried semiconductor region 6 may be a deep N-well region.

A first semiconductor region 10 may be formed within the semiconductor substrate 3. The first semiconductor region 10 may be disposed on the buried semiconductor region 6. The first semiconductor region 10 may have the same conductivity-type as that of the buried semiconductor region 6. For example, the first semiconductor region 10 and the buried semiconductor region 6 may have N-type conductivity. The first semiconductor region 10 may have a lower impurity concentration than that of the buried semiconductor region 6. The first semiconductor region 10 may be an N-type epitaxial layer. In an example embodiment, the first semiconductor region 10 may be an N-type drift region.

A second semiconductor region 30 and a third semiconductor region 40, having a different conductivity-type from one another, may be formed within the semiconductor substrate 3. The second semiconductor region 30 may have the same conductivity-type as that of the first semiconductor region 10, and the third semiconductor region 40 may have a different conductivity-type from that of the first semiconductor region 10. For example, when the first semiconductor region 10 has N-type conductivity, the second semiconductor region 30 may have N-type conductivity, and the third semiconductor region 40 may have P-type conductivity. The second semiconductor region 30 may have a higher impurity concentration than that of the first semiconductor region 10. The second semiconductor region 30 may have a lower impurity concentration than that of the buried semiconductor region 6. The second semiconductor region 30 may be an N-well region. The third semiconductor region 40 may be a P-well region. In an example embodiment, the third semiconductor region 40 may be a P-type drift region.

The second semiconductor region 30, when viewed on a plane, may be disposed to surround the third semiconductor region 40. The second semiconductor region 30, when viewed on a plane, is continuously formed without disconnection to surround the third semiconductor region 40. For example, the second semiconductor region 30, when viewed on a plane, may be formed continuously along an outside boundary of the third semiconductor region 40.

The third semiconductor region 40 may include a first portion 40_1 and a second portion 40_2 spaced apart from each other. A region between the first portion 40_1 and the second portion 40_2 of the third semiconductor region 40 may be referred to as a well disconnection region PC.

Hereinafter, the well disconnection region PC may be used as a term to describe a region between the first portion 40_1 and the second portion 40_2 of the third semiconductor region 40, which are spaced apart from each other, but example embodiments are not limited to the use of this term to describe such a well disconnection region. For example, the well disconnection region PC may be replaced with a term such as, for example, P-drift disconnection region, a P-well disconnection region, a first disconnection region, etc.

A first upper impurity region 60 and a second upper impurity region 70 having different conductivity-types may be formed within the semiconductor substrate 3.

The first upper impurity region 60 may have the same conductivity-type as that of the second semiconductor region 30, and may have a higher impurity concentration than that of the second semiconductor region 30. The first upper impurity region 60 may be disposed on the second semiconductor region 30. The first upper impurity region 60 may be overlapped with the second semiconductor region 30. The first upper impurity region 60 may be in contact with the second semiconductor region 30. In some embodiments, the first upper impurity region 60 may be coextensive with the second semiconductor region 30 (e.g., they may extend together in the lengthwise direction). The first upper impurity region 60 may have a narrower width than the second semiconductor region 30.

The second upper impurity region 70 may have the same conductivity-type as that of the third semiconductor region 40, and may have a higher impurity concentration than that of the third semiconductor region 40. The second upper impurity region 70 may be disposed on the third semiconductor region 40. At least a portion of the second upper impurity region 70 may be vertically overlapped with and in contact with the third semiconductor region 40. The second upper impurity region 70 may be formed to have a narrower width than that of the third semiconductor region 40.

In an example embodiment, the second upper impurity region 70 may be vertically overlapped with and in contact with the third semiconductor region 40, and extending through the well disconnection region PC between the first portion 40_1 and the second portion 40_2 of the third semiconductor region 40. The second upper impurity region 70 may be vertically overlapped with and in contact with the third semiconductor region 40 to intersect the well disconnection region PC between the first portion 40_1 and the second portion 40_2 of the third semiconductor region 40, crossing the well disconnection region PC between the first portion 40_1 and the second portion 40_2.

A first electrode 85 and a second electrode 90, which are spaced apart from each other, may be disposed on the semiconductor substrate 3. The first electrode 85 and the second electrode 90 may be formed of the same conductive material. For example, the first electrode 85 and the second electrode 90 may be formed of a metal silicide material such as, for example, cobalt silicide, nickel silicide, or the like.

The first electrode 85 may be vertically overlapped with the first upper impurity region 60. In some embodiments, the first electrode 85 may be coextensive with the first upper impurity region 60. The first electrode 85 may be in contact with the first upper impurity region 60 to form an ohmic contact. The first electrode 85 may be disposed to surround the second electrode 90. The second electrode 90 may be in contact with the second upper impurity region 70 and may be in contact with the first semiconductor region 10.

A bottom surface of the second electrode 90 may be adjacent to, and in contact with, a portion of an upper surface of the second upper impurity region 70 and a portion of an upper surface of the first semiconductor region 10. For example, the first semiconductor region 10 may include a first surface portion 10a in contact with the second electrode 90. The first surface portion 10a of the first semiconductor region 10 may be in contact with the second electrode 90 to form a Schottky diode SD with the second electrode 90.

An isolation region 20 may be disposed on the semiconductor substrate 3. In an example embodiment, the isolation region 20 may be a shallow trench isolation (STI) region formed by filling a trench 18 of the semiconductor substrate 3 with an insulating material.

The isolation region 20, when viewed on a plane, may be disposed between the first electrode 85 and the second electrode 90. At least a portion of the isolation region 20 may be disposed between the second semiconductor region 30 and third semiconductor region 40, and may be in contact with the second semiconductor region 30 and the third semiconductor region 40. The second semiconductor region 30 and the third semiconductor region 40 may be in contact with lower lateral surfaces of the isolation region 20, extending to cover a portion of a bottom surface of the isolation region 20. A central portion of the bottom surface of the isolation region 20 may be in contact with the first semiconductor region 10. For example, portions of the lower side surfaces and bottom surface of the isolation region 20 may be adjacent to the second semiconductor region 30 and the third semiconductor region 40, and another portion of the bottom surface of the isolation region 20 may be adjacent to the first semiconductor region 10. At least a portion of the isolation region 20 may be disposed between the first upper impurity region 60 and the second upper impurity region 70. Upper lateral surfaces of the isolation region 20 may be in contact with the first upper impurity region 60 and the second upper impurity region 70. For example, a first upper side surface of the isolation region 20 may be covered by the first upper impurity region 60, and a second upper side surface, opposite the first, may be covered by the second upper impurity region 70.

The isolation region 20 may include a first isolation portion 20_1 and a second isolation portion 20_2 spaced apart from each other. A region between the first isolation portion 20_1 and the second isolation portion 20_2 may be referred to as an isolation disconnection region IC. The isolation disconnection region IC may include a region passing through the isolation region 20 and provide a current path, allowing current to flow in a region between the first isolation portion 20_1 and the second isolation portion 20_2.

A second surface portion 10b of the first semiconductor region 10 may be formed within the isolation disconnection region IC. The second surface portion 10b of the first semiconductor region 10 may not be vertically overlapped with the first electrode 85 and the second electrode 90. The second surface portion 10b of the first semiconductor region 10 may be extended between the first portion 40_1 and the second portion 40_2 of the third semiconductor region 40.

The isolation disconnection region IC and the well disconnection region PC may be adjacent to each other. In an example embodiment, a portion of the well disconnection region PC may be extended inside the isolation disconnection region IC.

A portion of the second semiconductor region 30 may be formed within the isolation disconnection region IC. Inside the isolation disconnection region IC, the portion of the second semiconductor region 30 may be disposed between the second surface portion 10b of the first semiconductor region 10 and the first upper impurity region 60. For example, when viewed in a plan view, the portion of the second semiconductor region 30 may be bounded on a first side by the second surface portion 10b, bounded on a second side (opposite the first side) by the first upper impurity region 60, bounded on a first end by the first isolation portion 20_1, and bounded on a second end (opposite the first end) by the second isolation portion 20_2.

An insulating pattern 80 may be disposed on the semiconductor substrate 3 between the first electrode 85 and the second electrode 90. The insulating pattern 80 may cover the isolation disconnection region IC. The insulating pattern 80 may be vertically overlapped with or in contact with the second surface portion 10b of the first semiconductor region 10. When the first electrode 85 and the second electrode 90 are formed of a metal silicide material, the insulating pattern 80 may serve to prevent a metal silicide from being formed on the second surface portion 10b of the first semiconductor region 10 of the isolation disconnection region IC.

The second electrode 90 may be an anode electrode, and the first electrode 85 may be a cathode electrode. Thus, a current path of the Schottky diode SD, which may be configured of the second electrode 90 and the first surface portion 10a of the first semiconductor region 10, may include a first current path passing through the first semiconductor region 10 in a lower portion of the isolation region 20 from the second electrode 90 and leading to the first electrode 85, and a second current path passing through the isolation disconnection region IC from the second electrode 90. As described above, a plurality of current paths of the Schottky diode SD including the first current path and the second current path may improve driving capability of the Schottky diode SD. Thus, according to an example embodiment, the Schottky diode SD may improve driving capability without increasing an area. Thus, output current may be increased without increasing a size of a circuit or a device adopting the Schottky diode SD.

Figure 3:
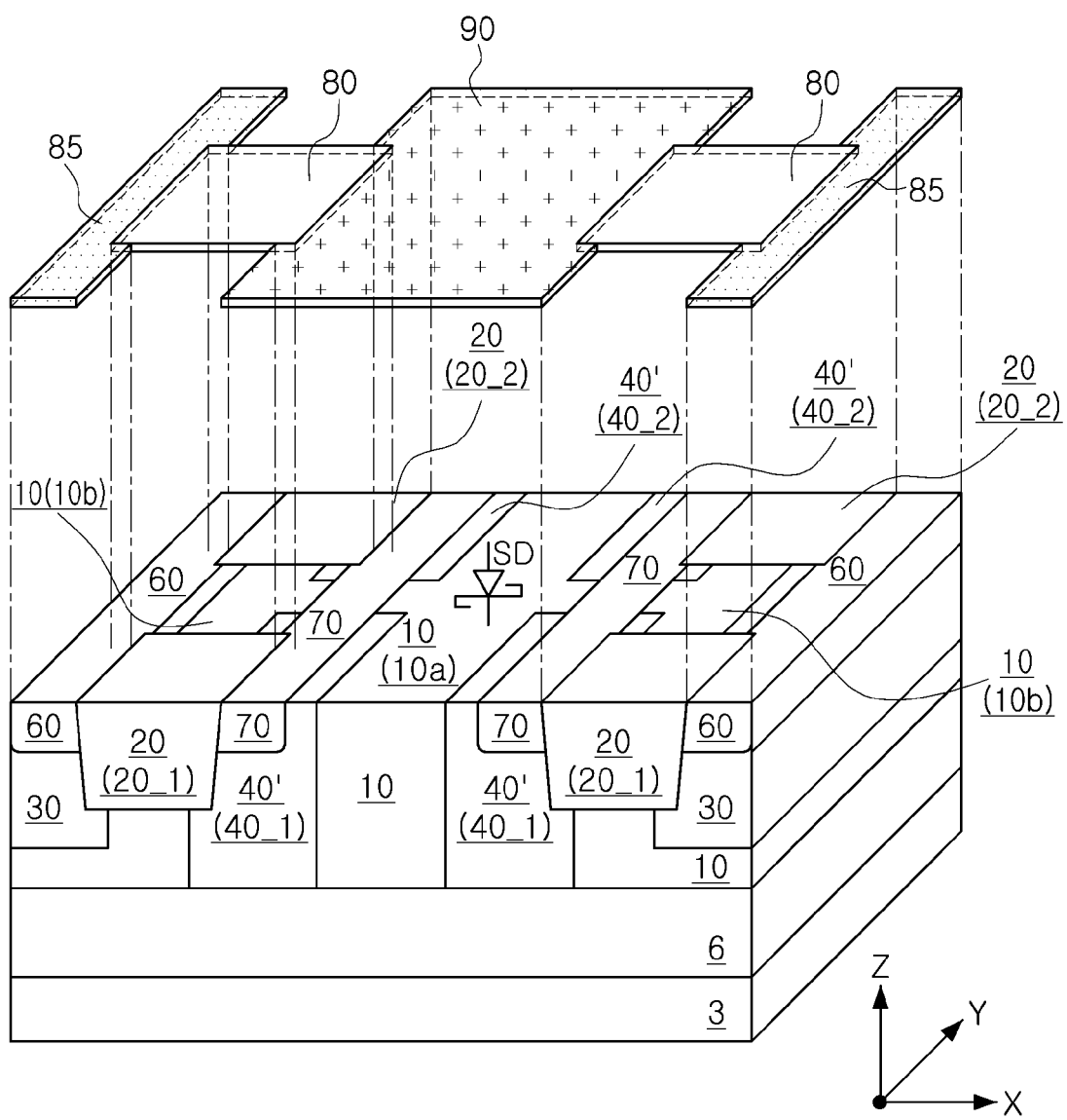
FIG. 3 is a perspective view illustrating a modified example of an electronic device according to an example embodiment.

According to an example embodiment, the third semiconductor region 40 may be disposed on the buried semiconductor region 6 to be spaced apart from the buried semiconductor region 6, but example embodiments are not limited thereto. For example, the third semiconductor region 40, as illustrated in FIGS. 1A, 1B, and 2A, may be modified to a third semiconductor region 40', as illustrated in FIG. 3, and may be in contact with the buried semiconductor region 6.

Figure 4:
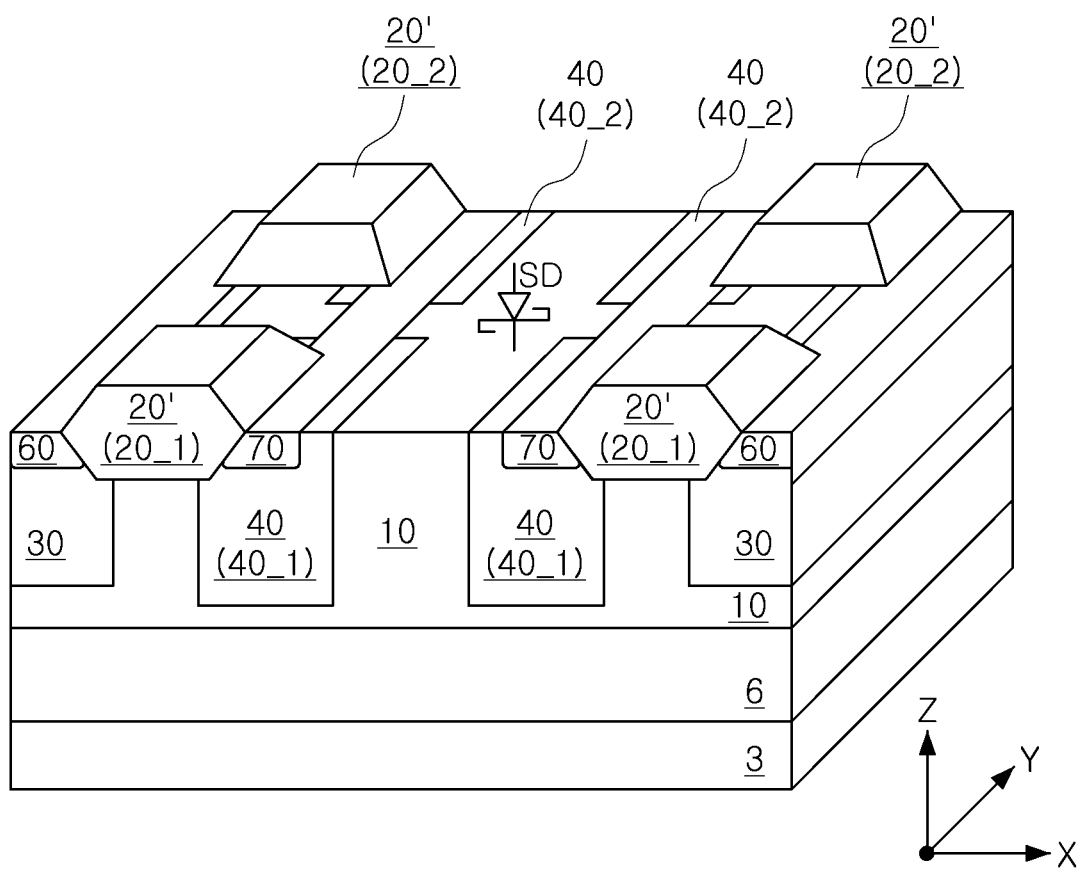
FIG. 4 is a perspective view illustrating another modified example of an electronic device according to an example embodiment.

According to an example embodiment, the isolation region 20 may be formed as a shallow trench isolation (STI) region formed inside the trench 18 of the semiconductor substrate 3, but example embodiments are not limited thereto. For example, the isolation region 20, illustrated in FIG. 2A, may be modified to a LOCal Oxidation of Silicon (LOCOS) isolation region 20', illustrated in FIG. 4. The LOCOS isolation region 20' in FIG. 4 may protrude to a surface of the semiconductor substrate 3.

Figure 5:
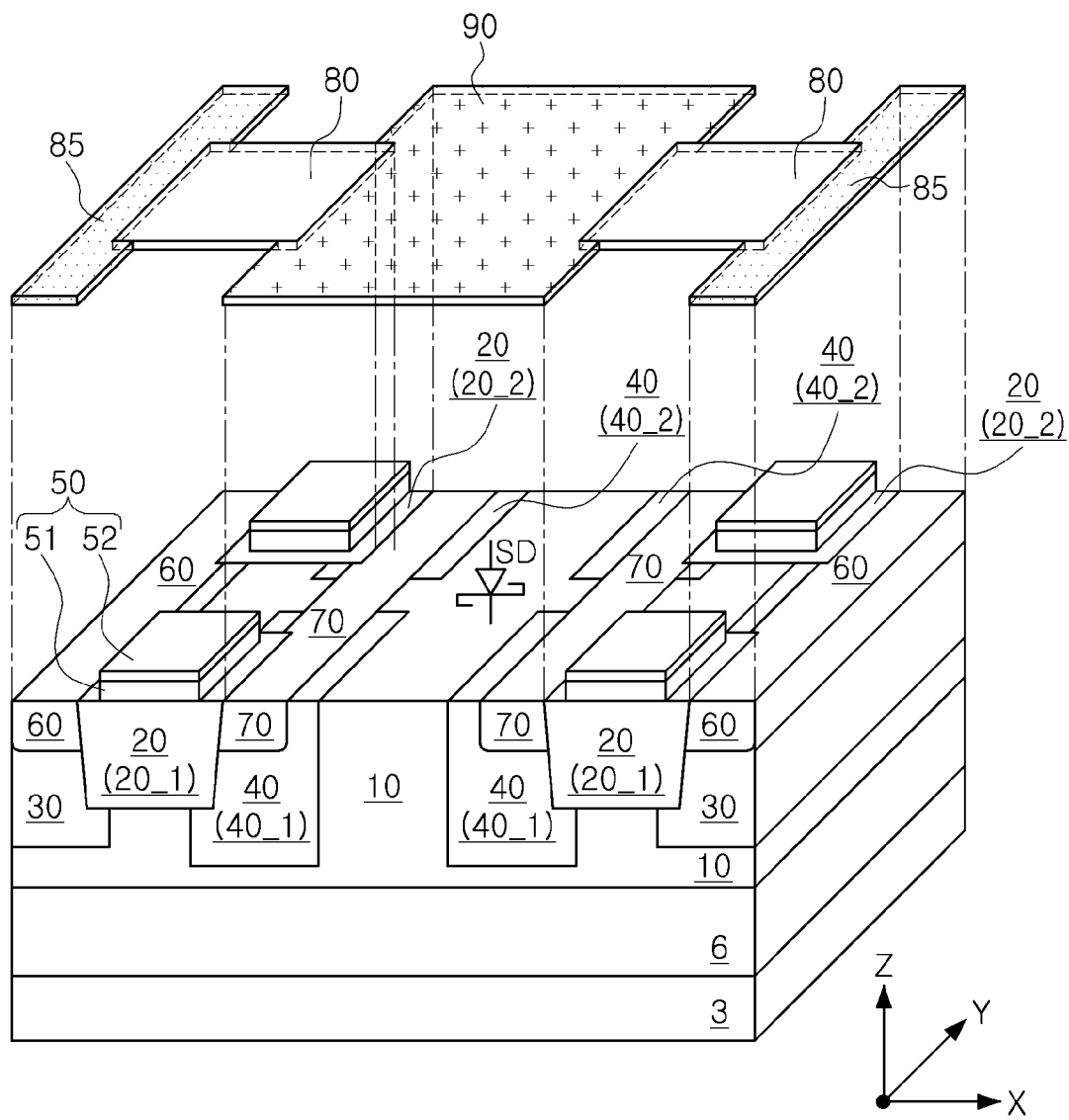
FIG. 5 is a perspective view illustrating another modified example of an electronic device according to an example embodiment.

According to an example embodiment, an electrode may not be disposed on the isolation region 20, but example embodiments are not limited thereto. For example, as illustrated in FIG. 5, in order to increase breakdown voltage of the Schottky diode SD, a third electrode 50, illustrated in FIG. 5, for applying an electric field to the first semiconductor region 10, may be disposed on the isolation region 20. The breakdown voltage may be proportional to the product of an electric field and a distance (a length). Thus, an electric field which may be generated from the third electrode 50 in FIG. 5 may affect the first semiconductor region 10 located on a current path of the Schottky diode SD to increase breakdown voltage of the Schottky diode SD. The third electrode 50, illustrated in FIG. 5, may include a polysilicon layer 51 and a metal-silicide layer 52 provided on the polysilicon layer 51. The metal-silicide layer 52 may be formed of the same material as that of the first electrode 85 and the second electrode 90, for example, cobalt silicide or nickel silicide.

Figure 6:
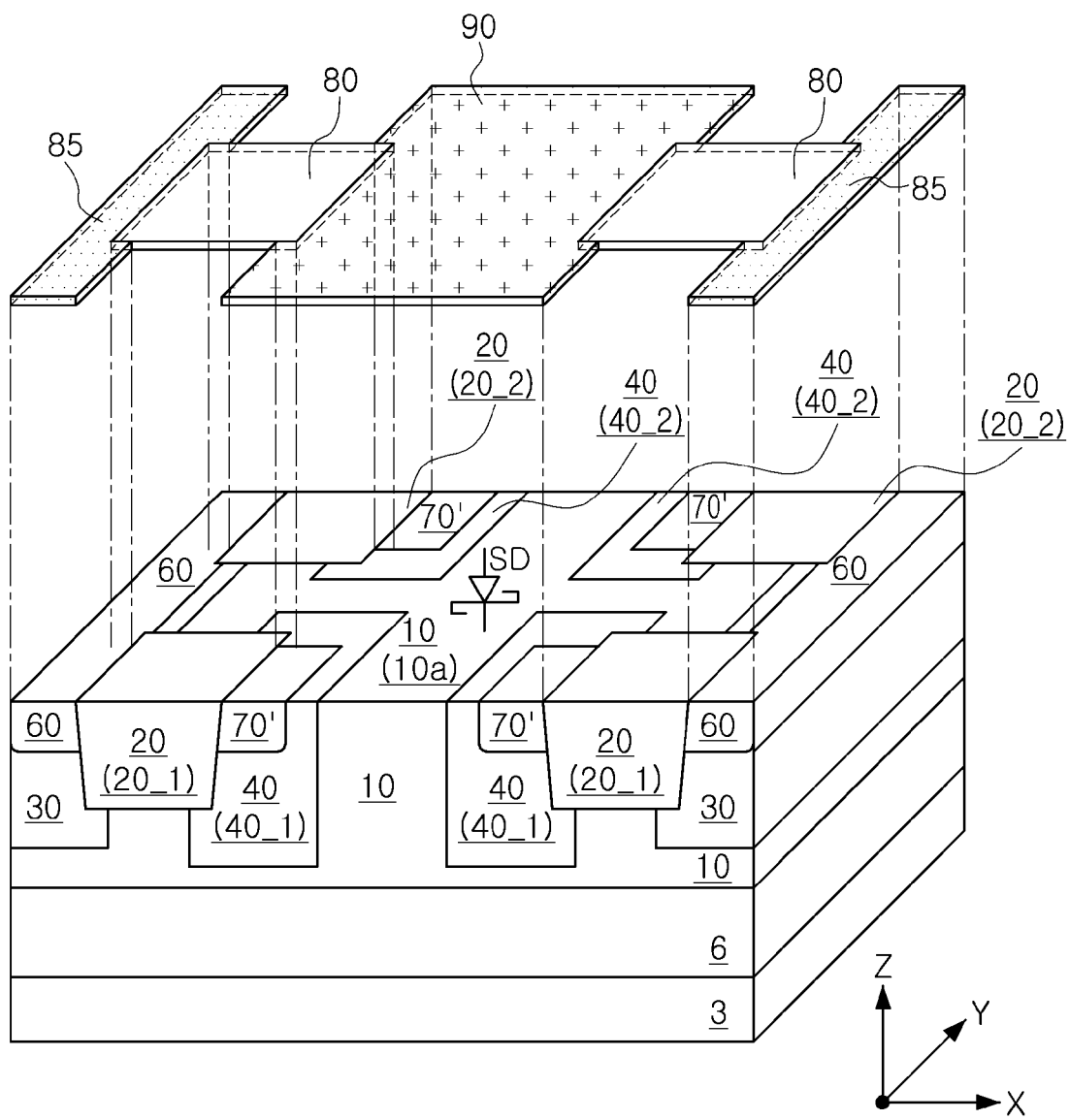
FIG. 6 is a perspective view illustrating another modified example of an electronic device according to an example embodiment.

According to an example embodiment, the second upper impurity region 70 may be in contact with the third semiconductor region 40 to be formed within the well disconnection region PC between the first portion 40_1 and the second portion 40_2 of the third semiconductor region 40, and may be in contact with the first semiconductor region 10 inside the well disconnection region PC, but example embodiments are not limited thereto. For example, the second upper impurity region 70, illustrated in FIGS. 1A, 1B, 2A, and 2B, may be modified to a second upper impurity region 70', as illustrated in FIG. 6, formed within the third semiconductor region 40 and not extended to a region between the first portion 40_1 and the second portion 40_2 of the third semiconductor region 40. Driving capability of the Schottky diode SD including the second upper impurity region 70' of FIG. 6, modified as described above, may be improved.

Figure 7A:
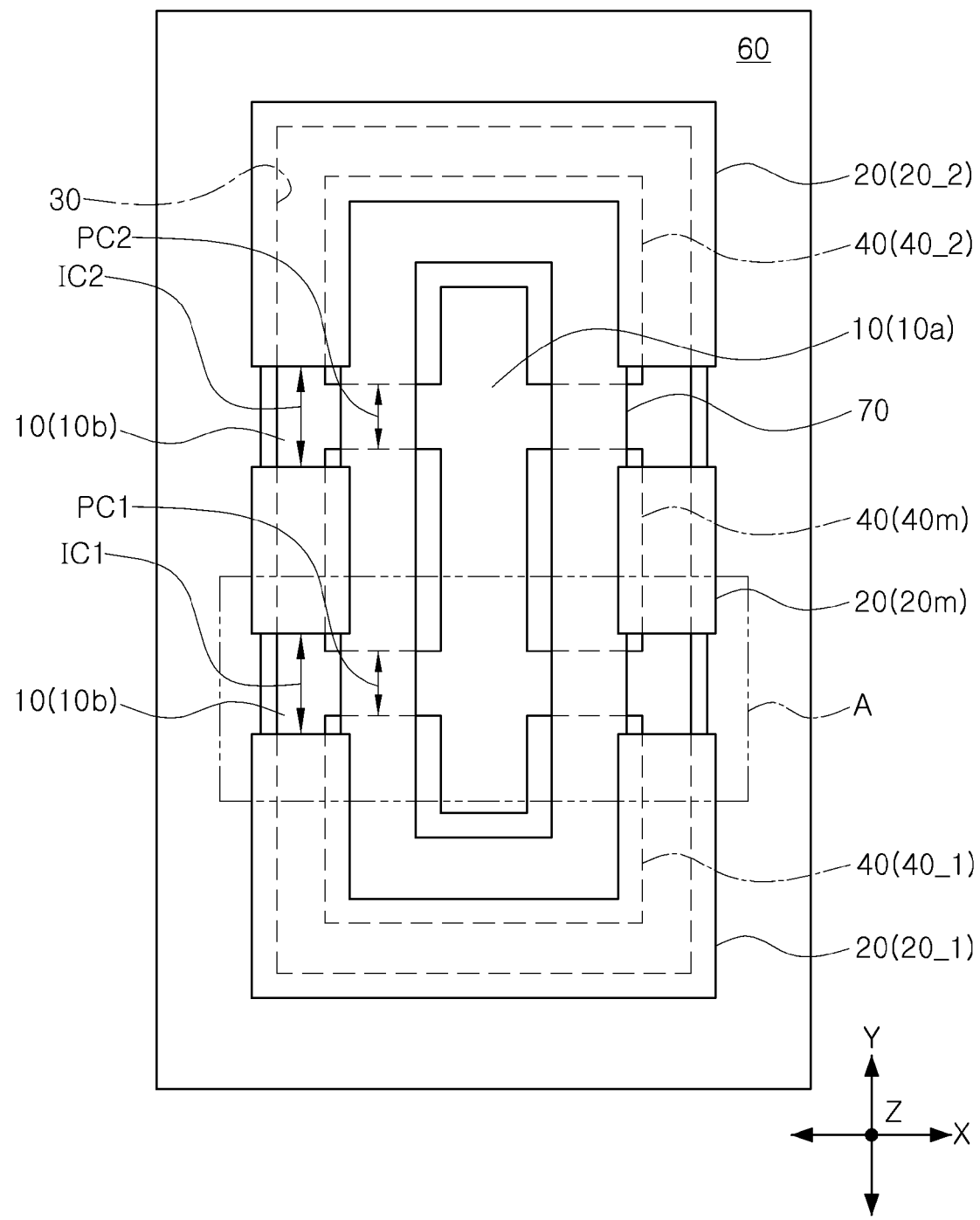
FIGS. 7A and 7B are plan views illustrating another modified example of an electronic device according to an example embodiment.
Figure 7B:
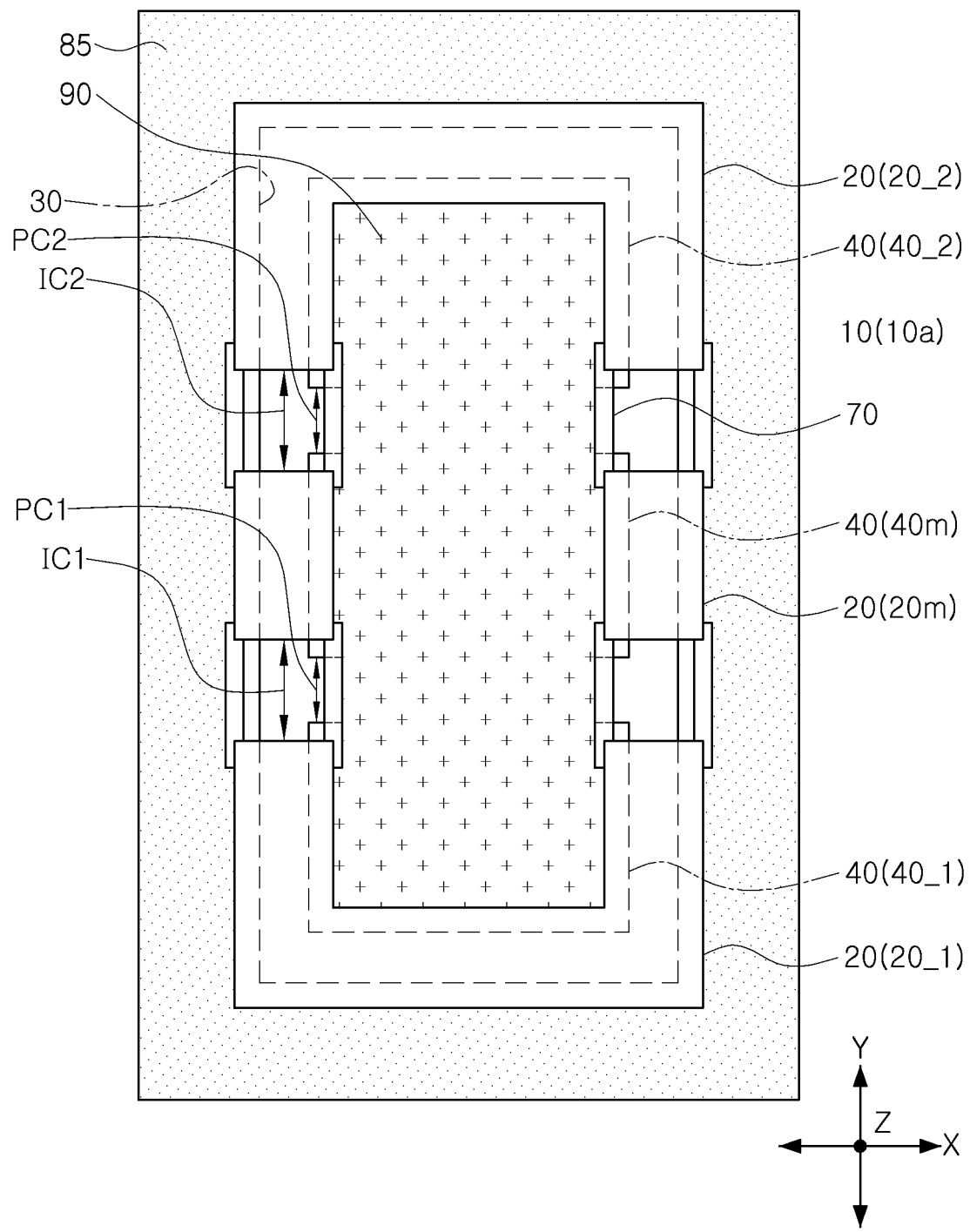

According to an example embodiment, the third semiconductor region 40 may include the first portion 40_1 and the second portion 40_2, spaced apart from each other, but example embodiments are not limited thereto. For example, as illustrated in FIGS. 7A and 7B, the third semiconductor region 40 may further include a middle portion 40m, as illustrated in FIGS. 7A and 7B, disposed between the first portion 40_1 and the second portion 40_2 and spaced apart from the first portion 40_1 and the second portion 40_2. A region between the middle portion 40m and the first portion 40_1 of the third semiconductor region 40 may be defined as a first well disconnection region PC1, and a region between the middle portion 40m and the second portion 40_2 of the third semiconductor region 40 may be defined as a second well disconnection region PC2. Each of the first well disconnection region PC1 and the second well disconnection region PC2 may be the same as the well disconnection region PC described with reference to FIGS. 1A, 1B, 2A, and 2B.

According to an example embodiment, the isolation region 20 may include the first isolation portion 20_1 and the second isolation portion 20_2 spaced apart from each other, but example embodiments are not limited thereto. For example, as illustrated in FIGS. 7A and 7B, the isolation region 20 may further include a middle isolation portion 20m, as illustrated in FIG. 7A, disposed between the first isolation portion 20_1 and the second isolation portion 20_2 and spaced apart from the first isolation portion 20_1 and the second isolation portion 20_2. A region between the first isolation portion 20_1 and the middle isolation portion 20m may be defined as a first isolation disconnection region IC1, and a region between the second isolation portion 20_2 and the middle isolation portion 20m may be defined as a second isolation disconnection region IC2. Each of the first isolation disconnection region IC1 and the second isolation disconnection region IC2 may be the same as the isolation disconnection region IC described with reference to FIGS. 1A, 1B, 2A, and 2B.

Figure 8A:
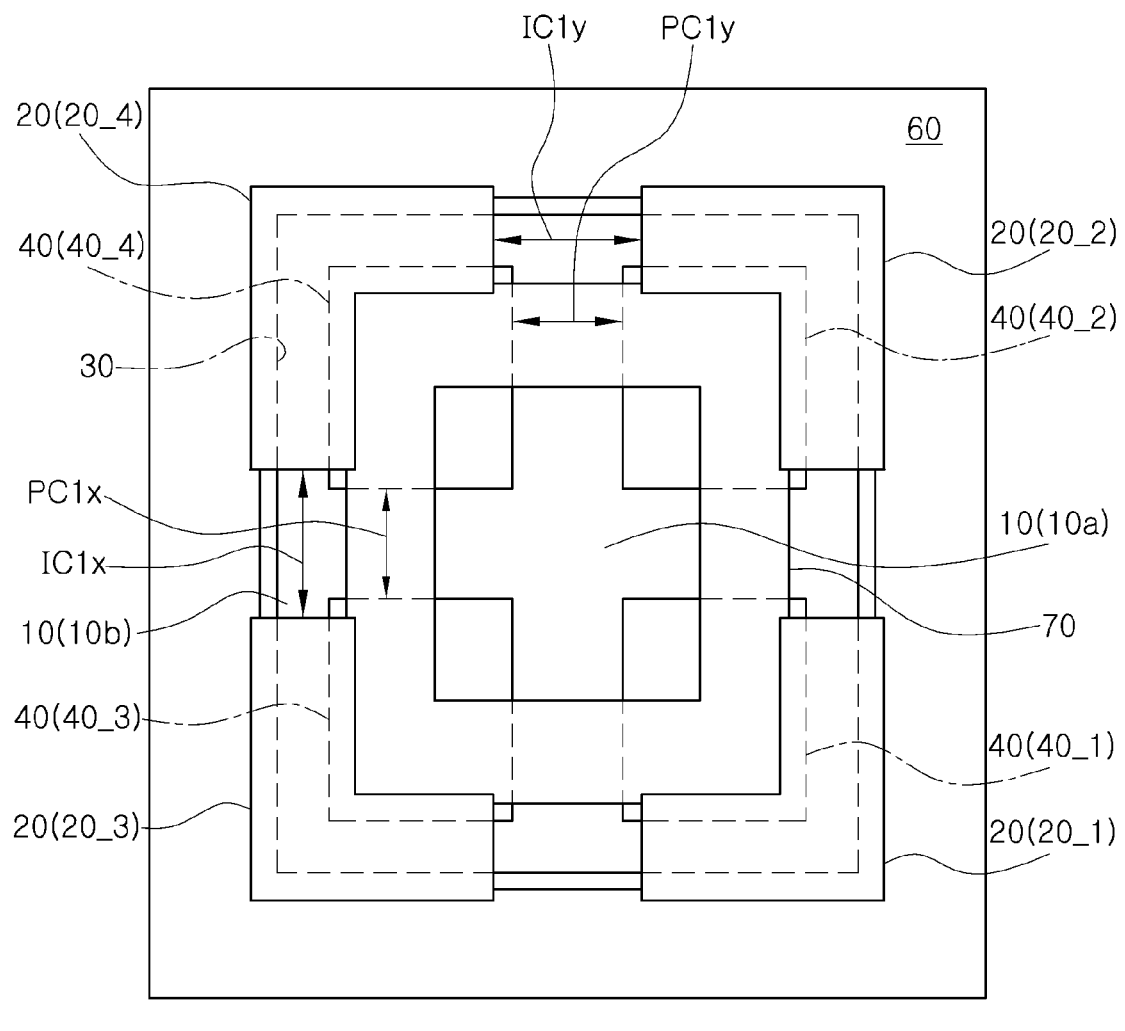
FIGS. 8A and 8B are plan views illustrating another modified example of an electronic device according to an example embodiment.
Figure 8A:
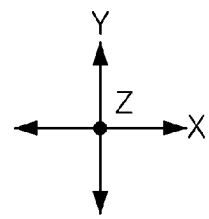
Figure 8B:
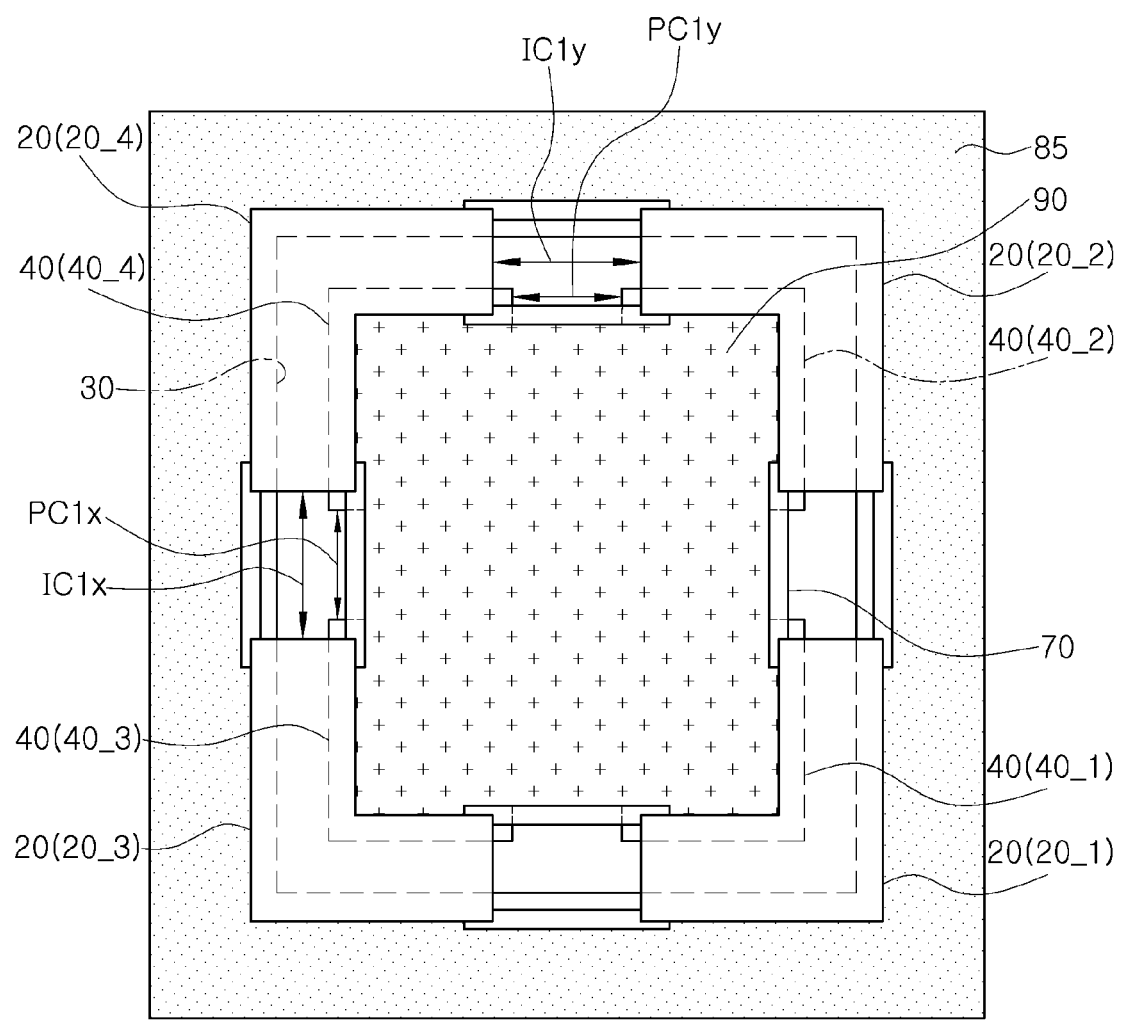

According to an example embodiment, the third semiconductor region 40 may include the first portion 40_1 and the second portion 40_2 arranged in a direction and spaced apart from each other, but example embodiments are not limited thereto. For example, as illustrated in FIGS. 8A and 8B, the third semiconductor region 40 may be modified to include portions arranged in a first direction X and portions arranged in a second direction Y perpendicular to the first direction X. For example, the third semiconductor region 40, as illustrated in FIGS. 8A and 8B, may include a first portion 40_1, a second portion 40_2, a third portion 40_3, and a fourth portion 40_4, spaced apart from each other. In the third semiconductor region 40 of FIGS. 8A and 8B, the first portion 40_1 and the second portion 40_2 may have segments arranged in the second direction Y, the third portion 40_3 and the fourth portions 40_4 may have segments arranged in the second direction Y, the first portion 40_1 and the third portion 40_3 may have segments arranged in the first direction X, and the second portion 40_2 and the fourth portion 40_4 may have segments arranged in the first direction X. Regions between the first portion 40_1, the second portion 40_2, the third portion 40_3, and the fourth portion 40_4 of the third semiconductor region 40 of FIGS. 8A and 8B adjacent to each other may be defined as well disconnection regions PC1x and PC1y, substantially the same as the well disconnection region PC described with reference to FIGS. 1A, 1B, 2A, and 2B. For example, well disconnection regions PC1x may be located between segments of the first portion 40_1, the second portion 40_2, the third portion 40_3, and the fourth portion 40_4 extending in the Y direction, and well disconnection regions PC1y may be located between segments of the first portion 40_1, the second portion 40_2, the third portion 40_3, and the fourth portion 40_4 extending in the X direction.

According to an example embodiment, the isolation region 20 may include the first isolation portion 20_1 and the second isolation portion 20_2 arranged in a same direction, but example embodiments are not limited thereto. For example, as illustrated in FIGS. 8A and 8B, the isolation region 20 may include isolation portions arranged in a first direction X, and isolation portions arranged in a second direction Y perpendicular to the first direction X. For example, the isolation portion 20, as illustrated in FIGS. 8A and 8B, may include a first isolation portion 20_1, a second isolation portion 20_2, a third isolation portion 20_3, and a fourth isolation portion 20_4 spaced apart from each other. In the isolation region 20 of FIGS. 8A and 8B, the first isolation portion 20_1 and the second isolation portion 20_2 may have segments arranged in the second direction Y, the third isolation portion 20_3 and the fourth isolation portion 20_4 may have segments arranged in the second direction Y, the first isolation portion 20_1 and the third isolation portion 20_3 may have segments arranged in the first direction X, and the second isolation portion 20_2 and the fourth isolation portion 20_4 may have segments arranged in the first direction X. Regions between the first isolation portion 20_1, the second isolation portion 20_2, the third isolation portion 20_3, and the fourth isolation portion 20_4 adjacent to each other may be defined as isolation disconnection regions IC1x and IC1y substantially the same as the isolation disconnection region IC described with reference to FIGS. 1A, 1B, 2A, and 2B. For example, isolation disconnection regions IC1x may be located between segments of the first isolation portion 20_1, the second isolation portion 20_2, the third isolation portion 20_3, and the fourth isolation portion 20_4 extending in the Y direction, and well disconnection regions IC1y may be located between segments of the first isolation portion 20_1, the second isolation portion 20_2, the third isolation portion 20_3, and the fourth isolation portion 20_4 extending in the X direction.

Figure 9A:
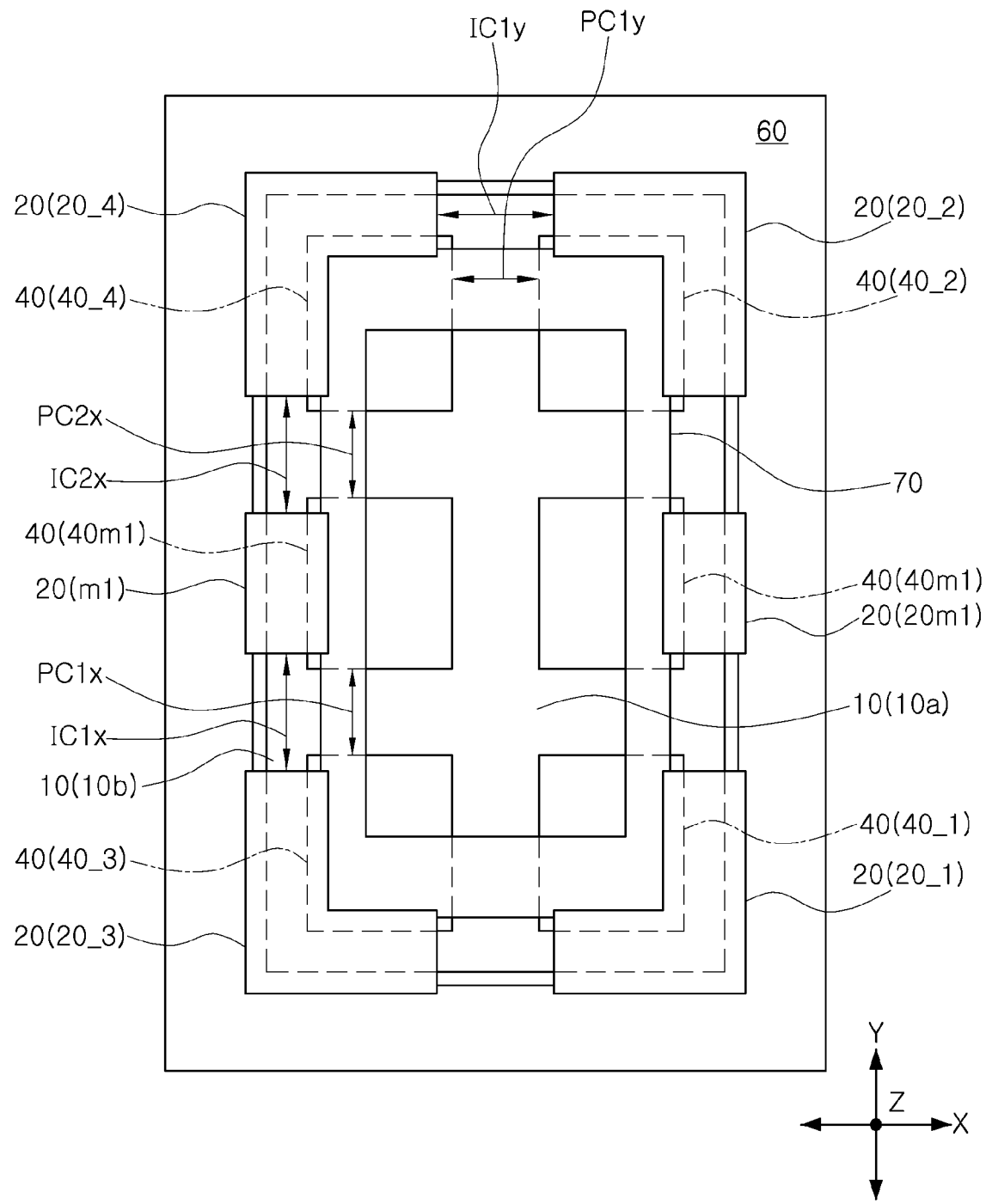
FIGS. 9A and 9B are plan views illustrating another modified example of an electronic device according to an example embodiment.
Figure 9B:
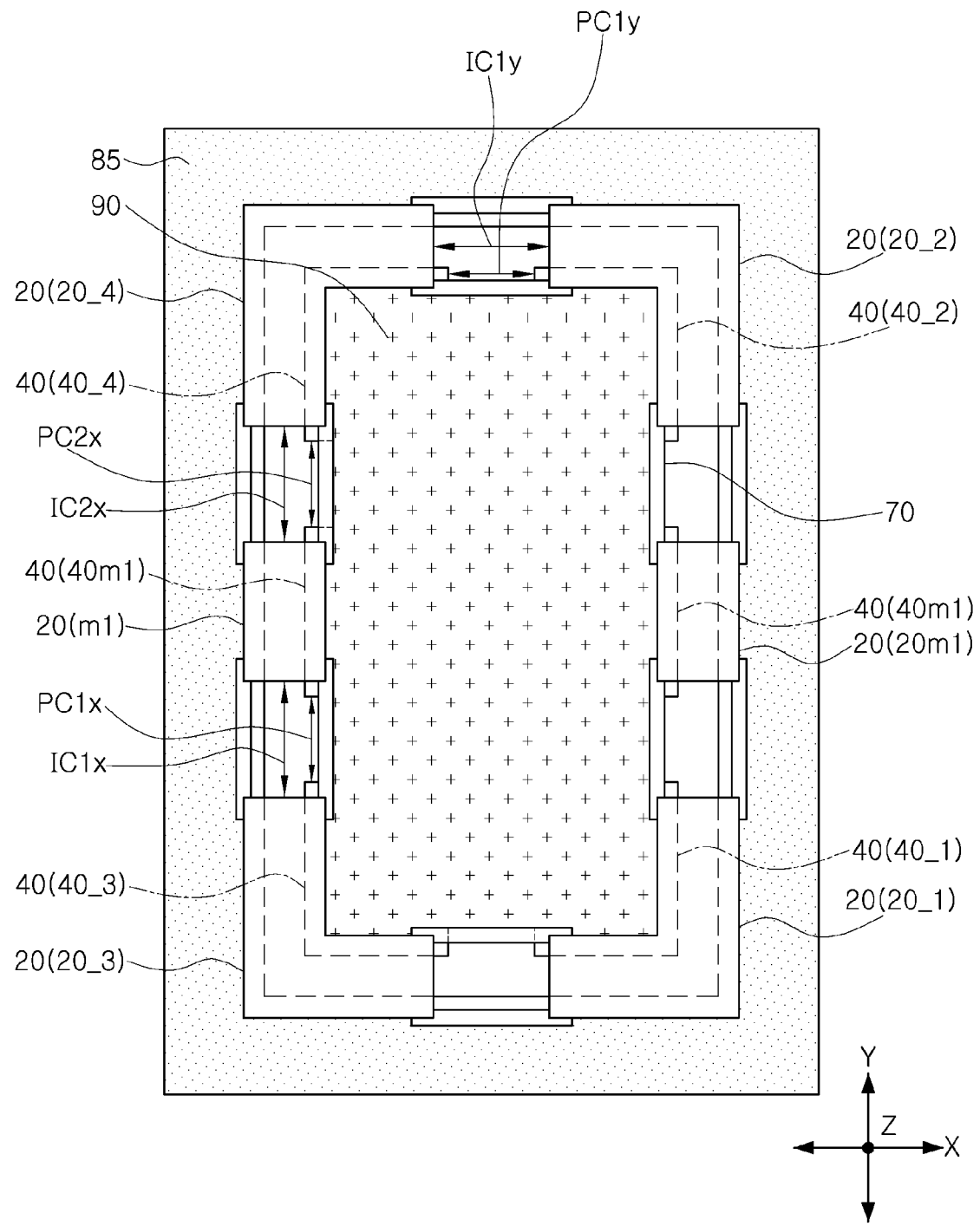

As illustrated in FIGS. 8A and 8B, the third semiconductor region 40, as illustrated in FIGS. 8A and 8B, may include the first portion 40_1, the second portion 40_2, the third portion 40_3, and the fourth portion 40_4 spaced apart from each other, but example embodiments are not limited thereto. For example, as illustrated in FIGS. 9A and 9B, the third semiconductor region 40 may further include a first middle portion 40m1 disposed between the first portion 40_1 and the second portion 40_2 and between the third portion 40_3 and the fourth portion 40_4. As described above, in the first portion 40_1, the second portion 40_2, the third portion 40_3, and the fourth portion 40_4, as well as the first middle portion 40m1 of the third semiconductor region 40 of FIGS. 9A and 9B, regions between portions adjacent to each other may be defined as well disconnection regions PC1x, PC2x, and PC1y substantially the same as the well disconnection region PC described with reference to FIGS. 1A, 1B, 2A, and 2B.

As illustrated in FIGS. 8A and 8B, the isolation region 20 may include the first isolation portion 20_1, the second isolation portion 20_2, the third isolation portion 20_3, and the fourth isolation portion 20_4 spaced apart from each other, but example embodiments are not limited thereto. For example, as illustrated in FIGS. 9A and 9B, the isolation region 20 may further include a first middle isolation portion 20m1 disposed between the first isolation portion 20_1 and the second isolation portion 20_2 and between the third isolation portion 20_3 and the fourth isolation portion 20_4, and spaced apart from the first isolation portion 20_1, the second isolation portion 20_2, the third isolation portion 20_3, and the fourth isolation portion 20_4. As described above, in the first isolation portion 20_1, the second isolation portion 20_2, the third isolation portion 20_3, and the fourth isolation portion 20_4, and the isolation middle portion 20m1, regions between portions adjacent to each other may be defined as isolation disconnection regions IC1x, IC2x, and IC1y, substantially the same as the isolation disconnection region IC described with reference to FIGS. 1A, 1B, 2A, and 2B.

Figure 10A:
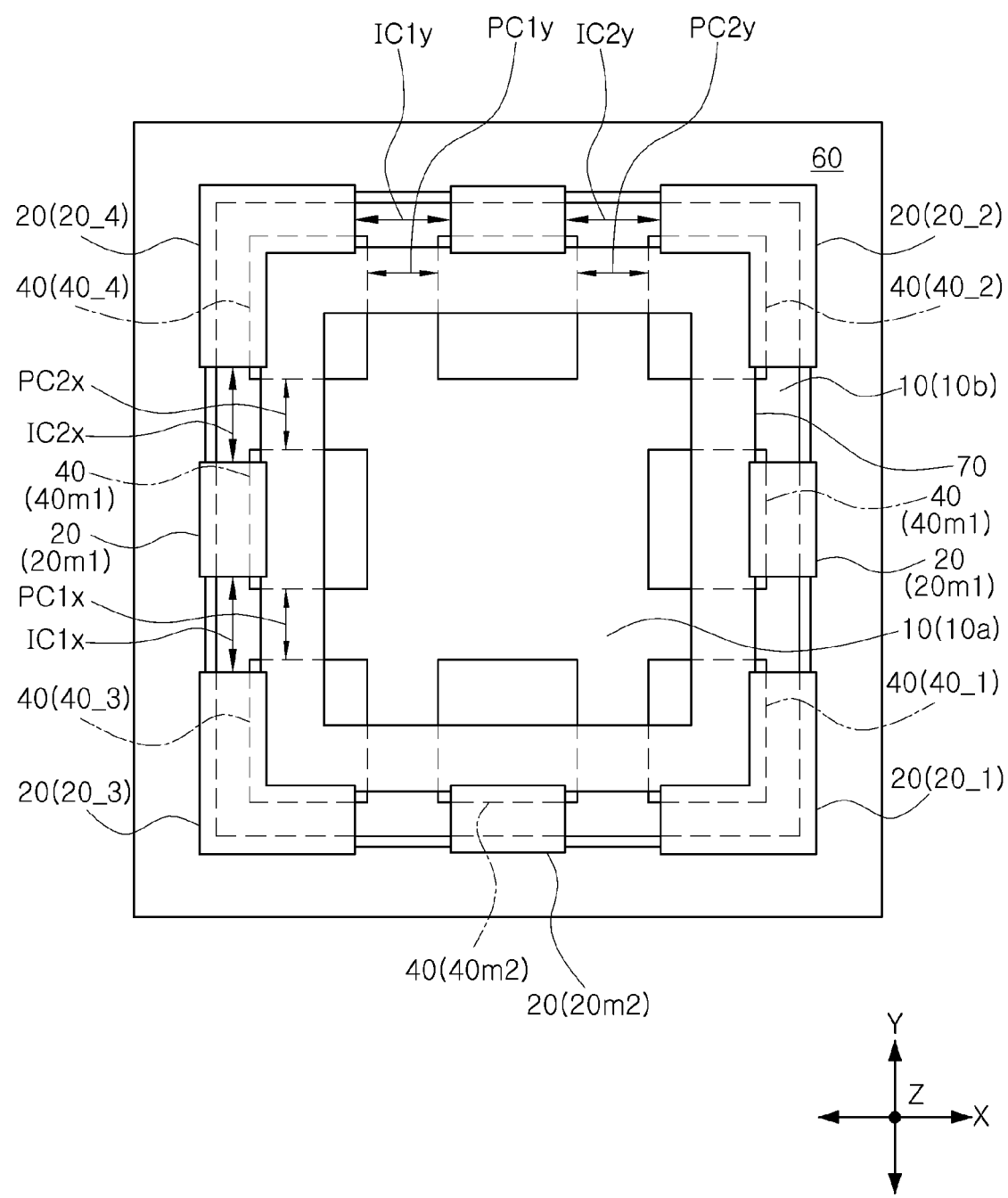
FIGS. 10A and 10B are plan views illustrating another modified example of an electronic device according to an example embodiment.
Figure 10B:
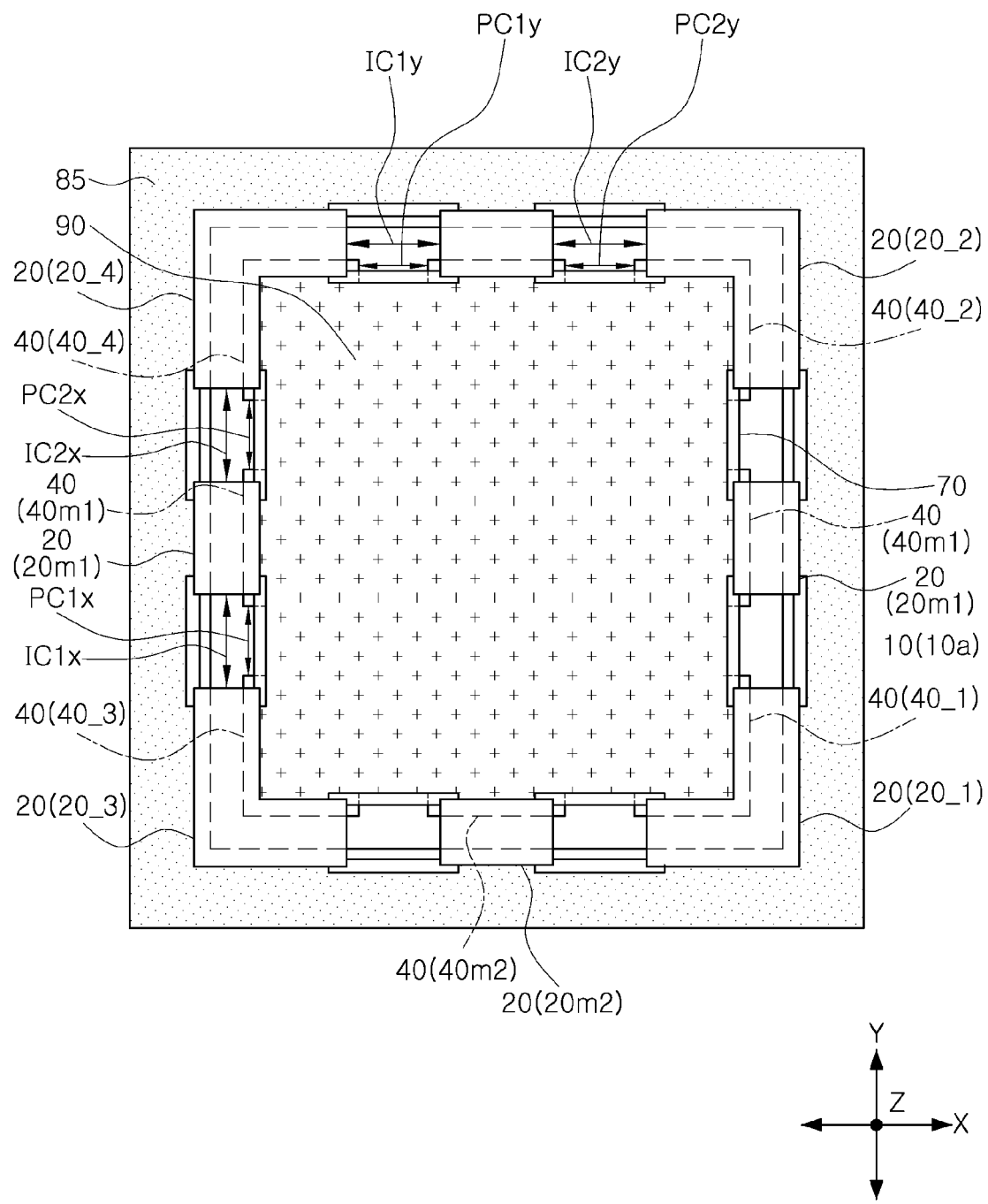

As illustrated in FIGS. 9A and 9B, the third semiconductor region 40 may include a first portion 40_1, a second portion 40_2, a third portion 40_3, and a fourth portion 40_4 spaced apart from each other as well as the first middle portion 40m1, but example embodiments are not limited thereto. For example, as illustrated in FIGS. 10A and 10B, the third semiconductor region 40 may include a first portion 40_1, a second portion 40_2, a third portion 40_3, a fourth portion 40_4, and the first middle portion 40m1 as well as a second middle portion 40m2 disposed between the first portion 40_1 and the third portion 40_3 and between the second portion 40_2 and the fourth portion 40_4. Regions between the portions 40_1, 40_2, 40_3, 40_4, 40m1, and 40m2 of the third semiconductor region 40 of FIGS. 10A and 10B may be defined as well disconnection regions PC1x, PC2x, PC1y, and PC2y substantially the same as the well disconnection region PC described with reference to FIGS. 1A, 1B, 2A, and 2B.

As illustrated in FIGS. 9A and 9B, the isolation region 20 may include the first isolation portion 20_1, the second isolation portion 20_2, the third isolation portion 20_3, and the fourth isolation portion 20_4 spaced apart from each other, and the first middle isolation portion 20m1, but example embodiments are not limited thereto. For example, as illustrated in FIGS. 10A and 10B, the isolation region 20 may include the first isolation portion 20_1, the second isolation portion 20_2, the third isolation portion 20_3, and the fourth isolation portion 20_4, and the first middle isolation portion 20m1 as well as a second middle isolation portion 20m2 disposed between the first isolation portion 20_1 and the third isolation portion 20_3 and between the second isolation portion 20_2 and the fourth isolation portion 20_4. Regions between the isolation portions 20_1, 20_2, 20_3, 20_4, 20m1, and 20m2 of the isolation region 20 of FIGS. 10A and 10B adjacent to each other may be defined as isolation disconnection regions IC1x, IC2x, IC1y, and IC2y substantially the same as the isolation disconnection region IC described with reference to FIGS. 1A, 1B, 2A, and 2B.

Figure 11A:
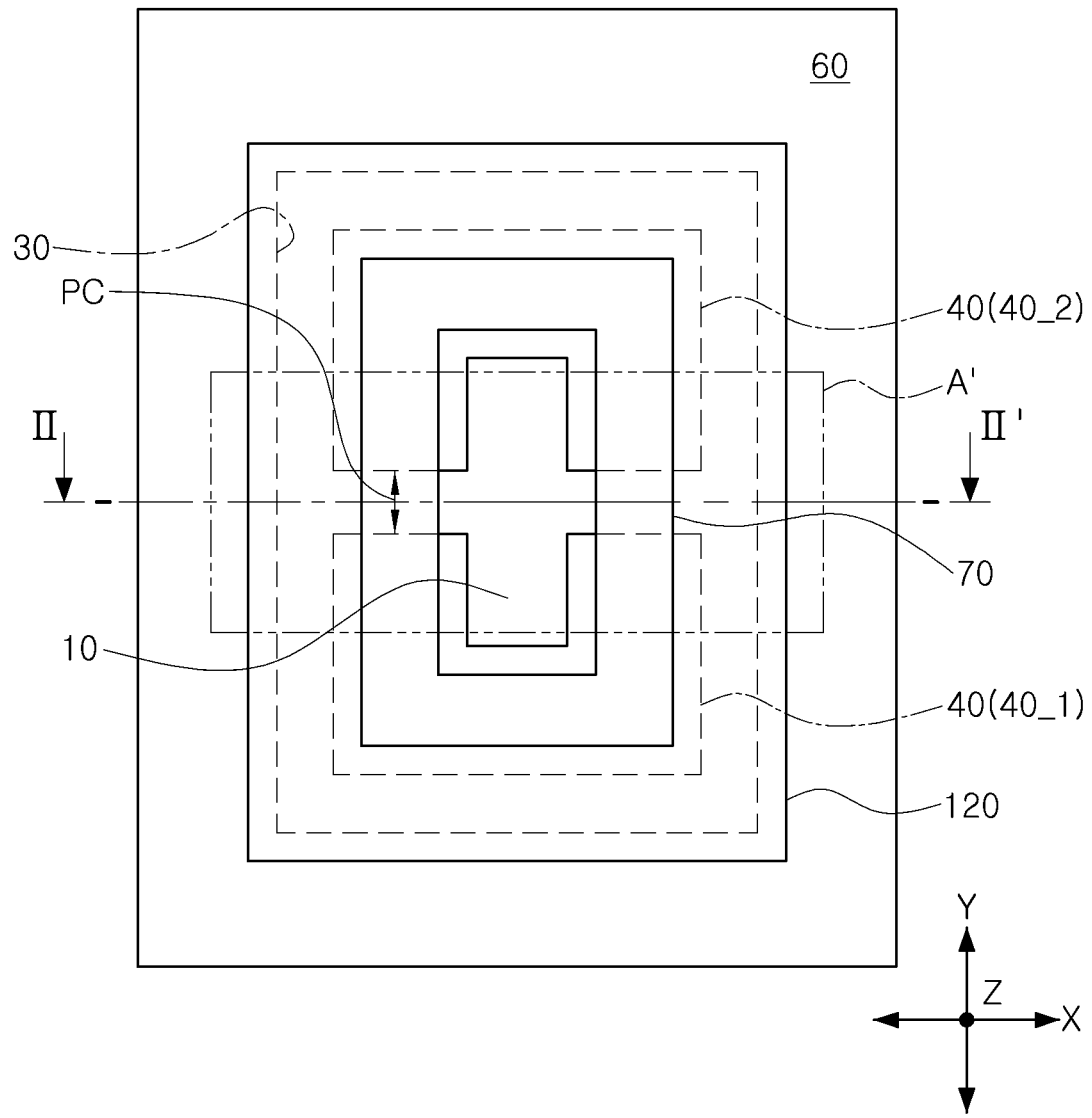
FIGS. 11A, 11B, and 11C are drawings illustrating another modified example of an electronic device according to an example embodiment.
Figure 11B:
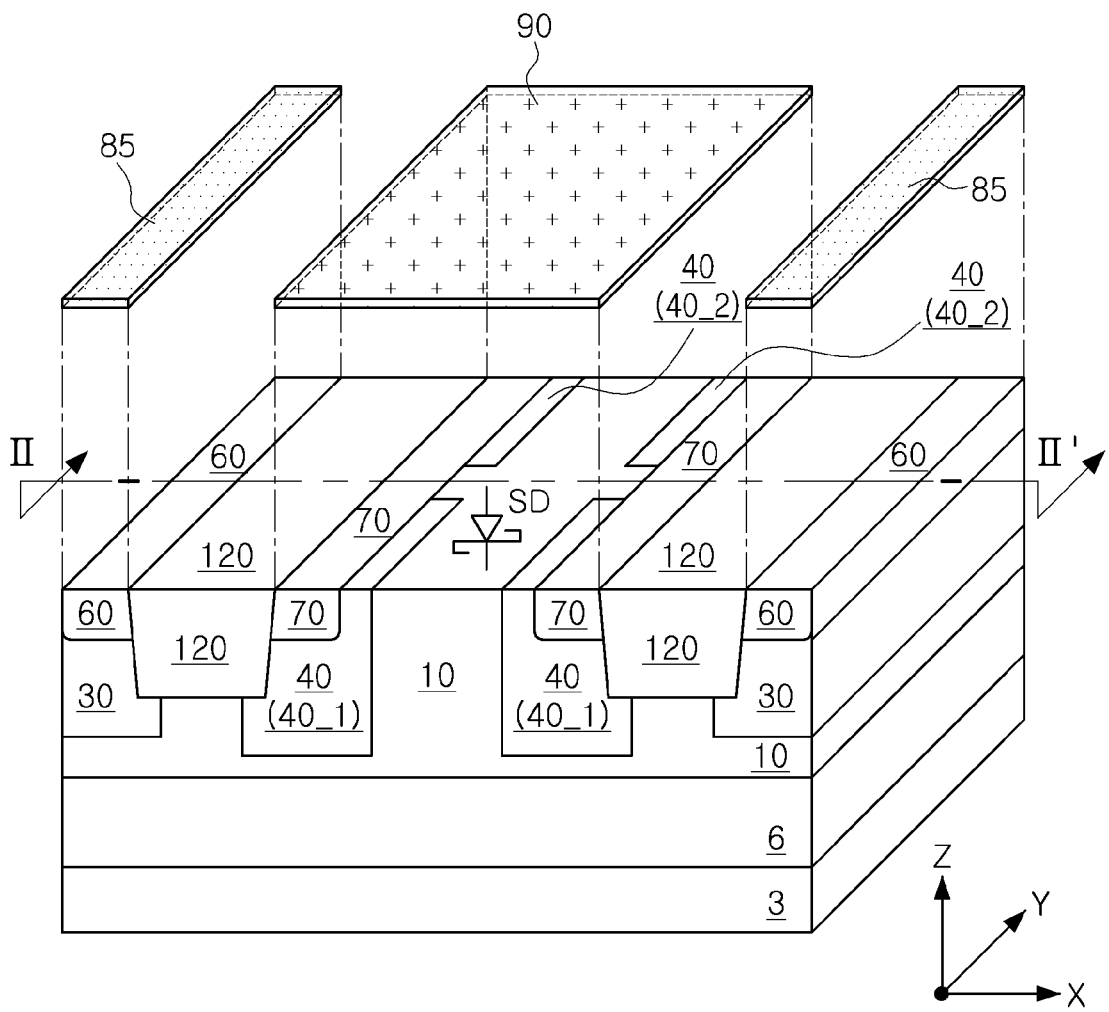
Figure 11C:
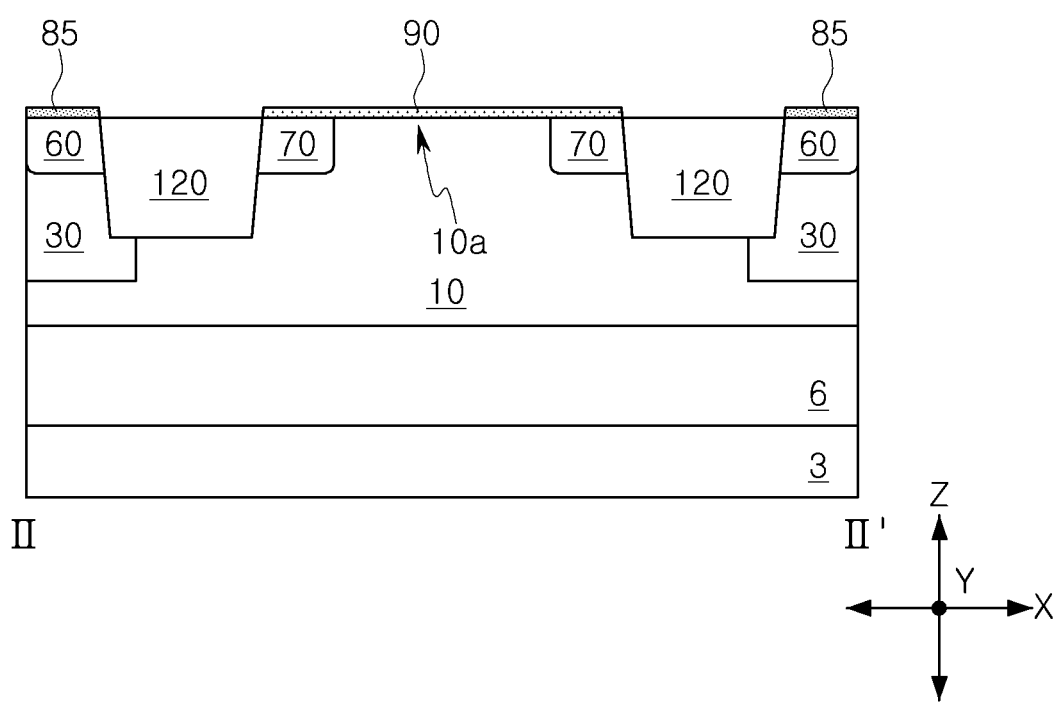

According to an example embodiment, the isolation region 20 may include portions 20_1 and 20_2 spaced apart from each other, but example embodiments are not limited thereto. For example, as illustrated in FIGS. 11A, 11B, and 11C, the isolation region 20 may be modified to an isolation region 120 having a ring or closed-loop shape, which is continuously connected, without an isolation disconnection region. Thus, a current path of the Schottky diode SD, which may be configured of the second electrode 90 and the first surface portion 10a of the first semiconductor region 10, may include a first current path passing through the first semiconductor region 10 in a lower portion of the isolation region 20 from the second electrode 90 and leading to the first electrode 85, and a second current path passing through the well disconnection region PC between the first portion 40_1 and the second portion 40_2 of the third semiconductor region 40 from the second electrode 90, passing through a lower portion of the isolation region 20, and leading to the first electrode 85. As described above, a plurality of current paths of the Schottky diode SD including the first current path and the second current path may improve driving capability of the Schottky diode SD.

Figure 12:
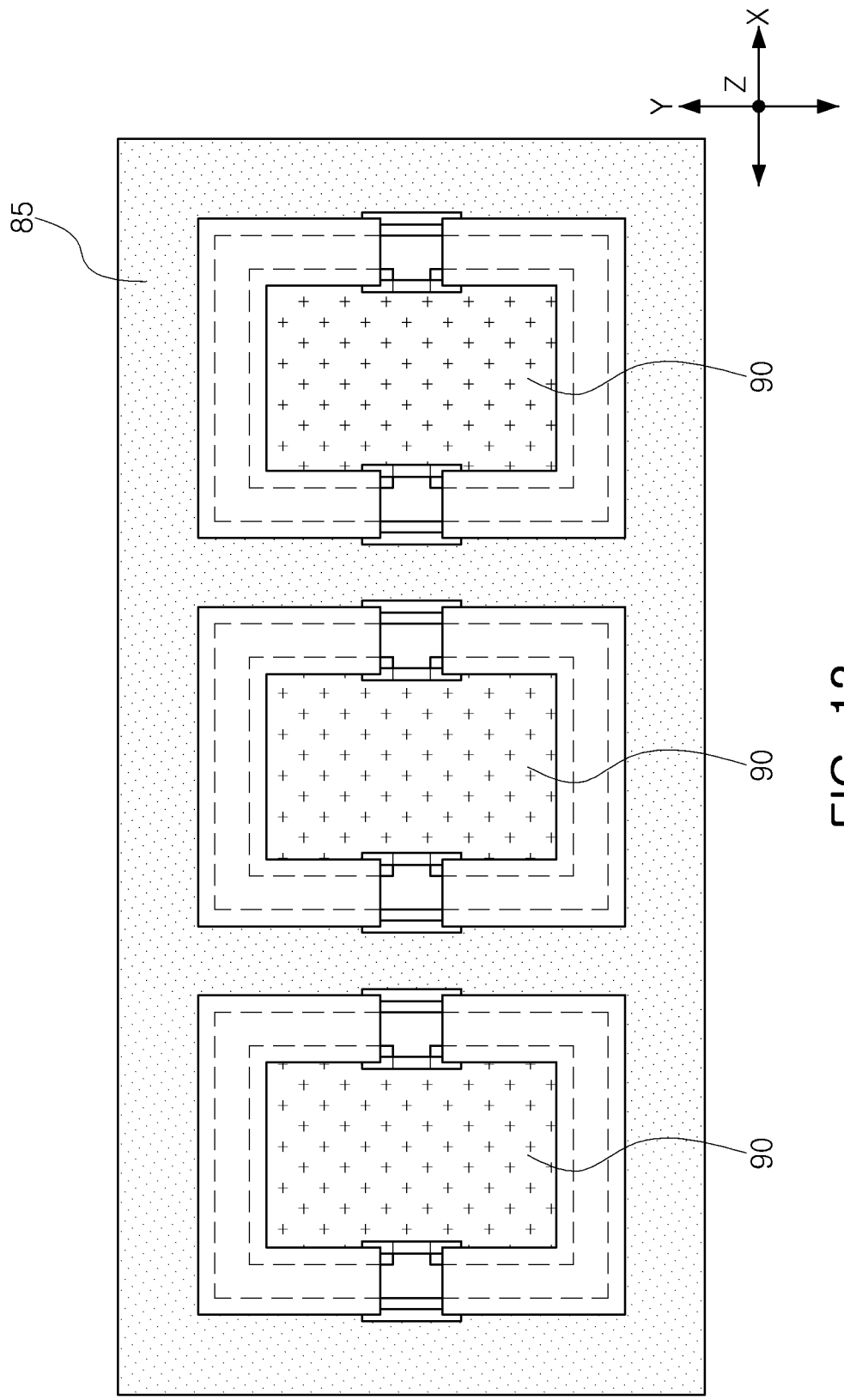
FIG. 12 is a plan view illustrating another modified example of an electronic device according to an example embodiment.

In FIGS. 1 to 11C, the second electrode 90 is described as an example, but example embodiments are not limited thereto. For example, as illustrated in FIG. 12, the second electrode 90 may be provided as a plurality of second electrodes disposed to be spaced apart from each other, and the first electrode 85 may be disposed to surround the plurality of second electrodes 90. FIG. 12 illustrates a case in which the second electrode 90 illustrated in FIG. 1B is provided as a plurality of second electrodes. In addition, structures of lower portions of the first electrode 85 and the plurality of second electrodes 90, as illustrated in FIG. 12, may be the same as structures of lower portions of the first electrode 85 and the second electrode 90 described with respect to FIGS. 1A, 1B, 2A, and 2B. A drawing in FIG. 12 is illustrated as an example embodiment, and the first electrode 85 and the second electrode 90 of modified examples described with respect to FIGS. 3 to 11C may be disposed as a shape and an arrangement thereof illustrated in FIG. 12

As described above, according to an example embodiment, a Schottky diode having improved driving capability may be provided. Thus, performance of an electronic device having the Schottky diode may be improved.

As set forth above, according to example embodiments of the present concept, an electronic device for improving driving capability of a Schottky diode may be provided.

While example embodiments have been shown and described above, it will be apparent to those skilled in the art that modifications and variations could be made without departing from the scope of the present disclosure as defined by the appended claims.

What is claimed is:

1. An electronic device comprising:
   a semiconductor substrate;
   a first electrode and a second electrode disposed on the semiconductor substrate and spaced apart from each other;
   a first semiconductor region formed within the semiconductor substrate, the first semiconductor region including a first surface portion in contact with the second electrode and forming a Schottky diode with the second electrode;
   a second semiconductor region formed within the semiconductor substrate, having the same conductivity-type as that of the first semiconductor region, and vertically overlapping the first electrode; and
   a third semiconductor region formed within the semiconductor substrate, having a different conductivity-type from that of the first semiconductor region, and vertically overlapping the second electrode; and
   an isolation region between the second semiconductor region and the third semiconductor region,
   wherein the isolation region includes a first isolation portion and a second isolation portion spaced apart from each other, when viewed in a plan view.

2. The electronic device of claim 1, wherein the third semiconductor region includes a first portion and a second portion spaced apart from each other, and
   wherein a region between the first portion and the second portion of the third semiconductor region is adjacent to a region between the first isolation portion and the second isolation portion.

3. The electronic device of claim 2, further comprising:
   a first upper impurity region disposed on the second semiconductor region and in contact with the first electrode; and
   a second upper impurity region disposed on the third semiconductor region and in contact with the second electrode.

4. The electronic device of claim 3, wherein the second upper impurity region is extended to the region between the first portion and the second portion of the third semiconductor region.

5. The electronic device of claim 1, wherein the first semiconductor region further includes a second surface portion not vertically overlapping the first electrode or the second electrode and disposed between the first isolation portion and the second isolation portion.

6. The electronic device of claim 5, further comprising:
   an insulating pattern overlapping the second surface portion of the first semiconductor region.

7. The electronic device of claim 1, wherein a region between the first isolation portion and the second isolation portion is disposed between the first electrode and the second electrode in a plan view.

8. The electronic device of claim 1, further comprising:
   a buried semiconductor region formed within the semiconductor substrate,
   wherein the first semiconductor region is disposed on the buried semiconductor region.

9. The electronic device of claim 1, further comprising:
   a third electrode provided on the isolation region.

10. The electronic device of claim 1, wherein the isolation region further includes a third isolation portion spaced apart from the first isolation portion and the second isolation portion.

11. An electronic device comprising:
    a semiconductor substrate;
    a first electrode and a second electrode provided on the semiconductor substrate;
    a first semiconductor region in the semiconductor substrate, the first semiconductor region including a first surface portion in contact with the second electrode;
    a second semiconductor region in the semiconductor substrate, the second semiconductor region having the same conductivity-type as that of the first semiconductor region and overlapping the first electrode;
    a third semiconductor region in the semiconductor substrate, the third semiconductor region having a different conductivity-type from that of the first semiconductor region, overlapping the second electrode, and including portions spaced apart from each other; and
    an isolation region between the second semiconductor region and the third semiconductor region.

12. The electronic device of claim 11, wherein the isolation region includes isolation portions spaced apart from each other, when viewed in a plan view.

13. The electronic device of claim 12, wherein a region between the portions spaced apart from each other of the third semiconductor region and a region between the isolation portions are adjacent to each other.

14. The electronic device of claim 11, further comprising:
a first upper impurity region disposed on the second semiconductor region, in contact with the first electrode, having the same conductivity-type as that of the second semiconductor region, and having a higher impurity concentration than that of the second semiconductor region; and
a second upper impurity region disposed on the third semiconductor region, in contact with the second electrode, having the same conductivity-type as that of the third semiconductor region, and having a higher impurity concentration than that of the third semiconductor region.

15. The electronic device of claim 11, wherein the first electrode surrounds the second electrode, and
wherein the isolation region is disposed between the first electrode and the second electrode in a plan view.

16. An electronic device comprising:
a semiconductor substrate;
a first electrode and a second electrode provided on the semiconductor substrate;
a first semiconductor region formed in the semiconductor substrate, the first semiconductor region including a first surface portion in contact with the second electrode to form a Schottky diode with the second electrode;
a second semiconductor region formed in the semiconductor substrate and vertically overlapping the first electrode;
a third semiconductor region formed in the semiconductor substrate and vertically overlapping the second electrode; and
an isolation region between the second semiconductor region and the third semiconductor region,
wherein the isolation region includes a first isolation portion and a second isolation portion spaced apart from one another when viewed in a plan view, and an isolation disconnection region between the first isolation portion and the second isolation portion, and
wherein the isolation disconnection region provides a current path between the first isolation portion and the second isolation portion.

17. The electronic device of claim 16, wherein the third semiconductor region includes a first portion and a second portion spaced apart from each other, and
wherein a region between the first portion and the second portion of the third semiconductor region is adjacent to the isolation disconnection region.

18. The electronic device of claim 17, further comprising:
a first upper impurity region disposed on the second semiconductor region and in contact with the first electrode; and
a second upper impurity region disposed on the third semiconductor region and in contact with the second electrode.

19. The electronic device of claim 18, wherein the second upper impurity region is extended to the region between the first portion and the second portion of the third semiconductor region.

20. The electronic device of claim 16, wherein the first semiconductor region further includes a second surface portion not vertically overlapping the first electrode or the second electrode and disposed between the first isolation portion and the second isolation portion.

* * * * *